(12) United States Patent
Oh et al.

(10) Patent No.: US 10,083,722 B2
(45) Date of Patent: Sep. 25, 2018

(54) MEMORY DEVICE FOR PERFORMING INTERNAL PROCESS AND OPERATING METHOD THEREOF

(71) Applicant: SAMSUNG ELECTRONICS CO., LTD., Suwon-si, Gyeonggi-Do (KR)

(72) Inventors: Reum Oh, Hwaseong-si (KR); Je-Min Ryu, Seoul (KR); Pavan Kumar Kasibhatla, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/607,699

(22) Filed: May 30, 2017

(65) Prior Publication Data
US 2017/0358327 A1    Dec. 14, 2017

(30) Foreign Application Priority Data

Jun. 8, 2016  (KR) .................... 10-2016-0071074
May 18, 2017 (KR) .................... 10-2017-0061636

(51) Int. Cl.
| | | |
|---|---|---|
| *G11C 5/06* | (2006.01) | |
| *G11C 5/02* | (2006.01) | |
| *G06F 12/084* | (2016.01) | |
| *G06F 12/0893* | (2016.01) | |
| *G11C 7/10* | (2006.01) | |
| *G11C 29/12* | (2006.01) | |
| *G11C 29/48* | (2006.01) | |
| *H01L 25/18* | (2006.01) | |

(52) U.S. Cl.
CPC .............. *G11C 5/02* (2013.01); *G06F 12/084* (2013.01); *G06F 12/0893* (2013.01); *G11C 7/1006* (2013.01); *G11C 29/1201* (2013.01); *G11C 29/48* (2013.01); *G11C 5/025* (2013.01); *G11C 2207/2245* (2013.01); *H01L 25/18* (2013.01)

(58) Field of Classification Search
CPC ....... G11C 5/063; G11C 7/18; G11C 11/4097; G11C 5/025; G11C 5/04
USPC ..................................................... 365/63, 51
See application file for complete search history.

(56) References Cited

U.S. PATENT DOCUMENTS

| | | |
|---|---|---|
| 7,796,446 B2 | 9/2010 | Ruckerbauer et al. |
| 8,042,082 B2 | 10/2011 | Solomon |
| 8,775,881 B2 | 7/2014 | Jeddeloh |
| 8,854,088 B2 | 10/2014 | Jeong |
| 8,977,822 B2 | 3/2015 | Resnick |
| 9,135,185 B2 | 9/2015 | Loh et al. |
| 9,218,854 B2 | 12/2015 | Stephens, Jr. |

(Continued)

*Primary Examiner* — Son Dinh
(74) *Attorney, Agent, or Firm* — Volentine, Whitt & Francos, PLLC

(57) ABSTRACT

A memory device includes a memory cell array having a plurality of memory cell groups with a corresponding plurality of independent channels, and the device and an operating method thereof perform an internal data processing operation for the memory cell groups. The memory device includes an internal command generator configured to generate one or more internal commands in order to perform an internal data processing operation in response to a reception of a command, and an internal common bus for a common internal processing channel which is disposed to be shared by the plurality of memory cell groups and configured to form a transmission path of data between the plurality of memory cell groups when the internal data processing operation is performed.

19 Claims, 31 Drawing Sheets

(56) References Cited

U.S. PATENT DOCUMENTS

| | | |
|---|---|---|
| 2010/0131684 A1 | 5/2010 | Johnson |
| 2011/0093662 A1 | 4/2011 | Walker et al. |
| 2012/0246401 A1 | 9/2012 | Agam et al. |
| 2013/0258788 A1 | 10/2013 | Ide et al. |
| 2013/0279276 A1 | 10/2013 | Schaefer |
| 2013/0280863 A1 | 10/2013 | Suh |
| 2014/0071771 A1 | 3/2014 | Hollis |
| 2014/0181415 A1 | 6/2014 | Loh et al. |
| 2014/0181458 A1 | 6/2014 | Loh et al. |
| 2014/0247637 A1 | 9/2014 | Best et al. |
| 2014/0354311 A1 | 12/2014 | Byeon |
| 2015/0161072 A1 | 6/2015 | Gillingham |
| 2016/0012865 A1* | 1/2016 | Lee .................... H01L 25/0655 365/51 |
| 2016/0379689 A1* | 12/2016 | Roh .................... G11C 7/1063 711/104 |

\* cited by examiner

FIG. 12B

| CH A RD | CH A lat_off | CH B RD | CH A WR | CH A lat_on | CH B WR |

FIG. 13C

| CH B RD | A0 off A1 on | WR Buf off | Data_WR | A1 off A2 on | CH B WR |

FIG. 14B

| CH B RD | CH B A0 off | CH A RD | CH A A0 off | All CH A1 on | WR Buf off | Data_WR |
|---|---|---|---|---|---|---|

| All CH A1 off | CH A A2 on | CH A WR | CH B A2 on | CH B WR |
|---|---|---|---|---|

FIG. 15B

| CH B RD | CH B B0 off | WR Buf off | Data_WR | CH A A0 off | All CH A1,B1 on |
|---|---|---|---|---|---|

| Data_mask | RD@Mask=H WR@Mask=L |
|---|---|

MEMORY DEVICE FOR PERFORMING INTERNAL PROCESS AND OPERATING METHOD THEREOF

CROSS-REFERENCE TO RELATED APPLICATION

This application claims the benefit of Korean Patent Application No. 10-2016-0071074, filed on Jun. 8, 2016, in the Korean Intellectual Property Office, the disclosure of which is incorporated herein in its entirety by reference.

BACKGROUND

The inventive concept relates to a memory device, and more particularly, to a memory device for performing an internal process and an operating method thereof.

The capacity and speed of a semiconductor memory device widely used in a high-performance electronic system are being increased. As an example of a semiconductor memory device, a dynamic random access memory (DRAM), which is a volatile memory, is a memory in which data is determined by charges stored in a capacitor.

The semiconductor memory device may exchange data with an external memory controller through one or more channels. For example, according to a type of command provided from the memory controller, a processing operation for data provided from the memory controller may be performed, or data stored therein may be read, a processing operation for the read data is performed, and then the processed data may be provided to the memory controller. In this case, since a bandwidth is occupied between the semiconductor memory device and the memory controller, a problem in that a use efficiency of the channel is reduced and power consumption is increased may occur.

SUMMARY

The inventive concept is directed to memory devices, and methods of operating a memory device, which employ an internal processing channel shared among at least two memory cell groups for performing internal processing operations for the memory cells of the at least two memory cell groups of the memory device.

According to an aspect of the inventive concept, there is provided a memory device, comprising: a buffer die having an internal command generator configured to receive from an external memory controller a first external command for performing at least one internal data processing operation by the memory device, and in response thereto to generate at least two internal commands for causing the memory device to execute corresponding internal memory operations to perform the at least one internal data processing operation; a first core die and a second core die stacked together with the buffer die, each of the first and second core dies having a plurality of dynamic random access memory (DRAM) cells, the DRAM cells being arranged into at least a first memory cell group of the first core die and a second memory cell group of the second core die; a plurality of through silicon vias (TSVs) extending through the first and second core dies so as to connect to the buffer die; at least two independent channels each associated with a corresponding one of the first and second memory cell groups, the at least two independent channels each including a corresponding set of the TSVs; and a common internal processing channel shared among the first and second memory cell groups of the first and second core dies.

According to another aspect of the inventive concept, there is provided a memory device, comprising: a buffer die having an internal command generator configured to receive from an external memory controller a first external command for performing at least one internal data processing operation by the memory device, and in response thereto to generate at least two internal commands for causing the memory device to execute corresponding internal memory operations to perform the at least one internal data processing operation; at least one core die stacked together with the buffer die, the at least one core die having a plurality of dynamic random access memory (DRAM) cells arranged into a plurality of memory cell groups; a plurality of through silicon vias (TSVs) extending through the at least one core die so as to connect to the buffer die; and at least two independent channels each associated with a corresponding one of the memory cell groups, the at least two independent channels each comprising a corresponding set of the TSVs, wherein at least some of the TSVs are shared by at least two of the plurality of memory cell groups when the memory device performs the at least one internal data processing operation.

According to a further aspect of the inventive concept, there is provided a memory device, comprising: a plurality of dynamic random access memory (DRAM) cells arranged into a plurality of memory cell groups; a plurality of independent channels each associated with a corresponding one of the plurality of memory cell groups; an internal command generator configured to receive from an external memory controller at least a first external command for performing at least one internal data processing operation by the memory device, and in response thereto to generate at least two internal commands for causing corresponding memory operations to be executed to perform the at least one internal data processing operation; and a common internal processing channel shared among the plurality of memory cell groups.

According to still another aspect of the inventive concept, there is provided A method comprising: receiving an external command at a memory device comprising a plurality of dynamic random access memory (DRAM) cells arranged into at least two memory cell groups, at least two independent channels each associated with a corresponding one of the at least two memory cell groups, and a common internal processing channel shared among the at least two memory cell groups; in response to the external command, determining whether to perform of at least one internal data processing operation by the memory device; and when it is determined to perform the at least one internal data processing operation by the memory device: generating at least two internal commands for causing corresponding memory operations to be executed to perform the at least one internal data processing operation, and selecting one or more of the plurality of memory cell groups to perform the memory operations.

According to yet another aspect of the inventive concept, there is provided a method, comprising: receiving an external command at a memory device comprising a plurality of dynamic random access memory (DRAM) cells arranged into at least two memory cell groups, at least two independent channels each associated with a corresponding one of the at least two memory cell groups, and a common internal processing channel shared among the at least two memory cell groups; in response to the external command, determining whether the external command is a normal command or a command for performing at least one internal data processing operation by the memory device; when it is determined to perform the at least one internal data processing operation by the memory device, performing the at least one internal data processing operation through a common internal processing channel shared by at least two memory cell groups; and when it is determined that the external command is a normal command, executing the normal command via one of a plurality of independent channels each associated with a corresponding one of the at least two memory cell groups.

BRIEF DESCRIPTION OF THE DRAWINGS

Embodiments of the inventive concept will be more clearly understood from the following detailed description taken in conjunction with the accompanying drawings.

FIGS. 12A and 12B are block diagrams illustrating an example in which a data swap is performed in an example embodiment of a memory device.

FIGS. 13A, 13B and 13C are block diagrams illustrating an example in which read-modify-write (RMW) is performed in an example embodiment of a memory device.

FIGS. 14A and 14B are block diagrams illustrating an example in which RMW operations are simultaneously performed on two or more core dies in an example embodiment of a memory device.

FIGS. 15A and 15B are block diagrams illustrating an example in which a mask write is performed in an example embodiment of a memory device.

DETAILED DESCRIPTION OF THE EMBODIMENTS

Hereinafter, embodiments which illustrate the inventive concept will be described in detail with reference to the accompanying drawings.

Figure 1:
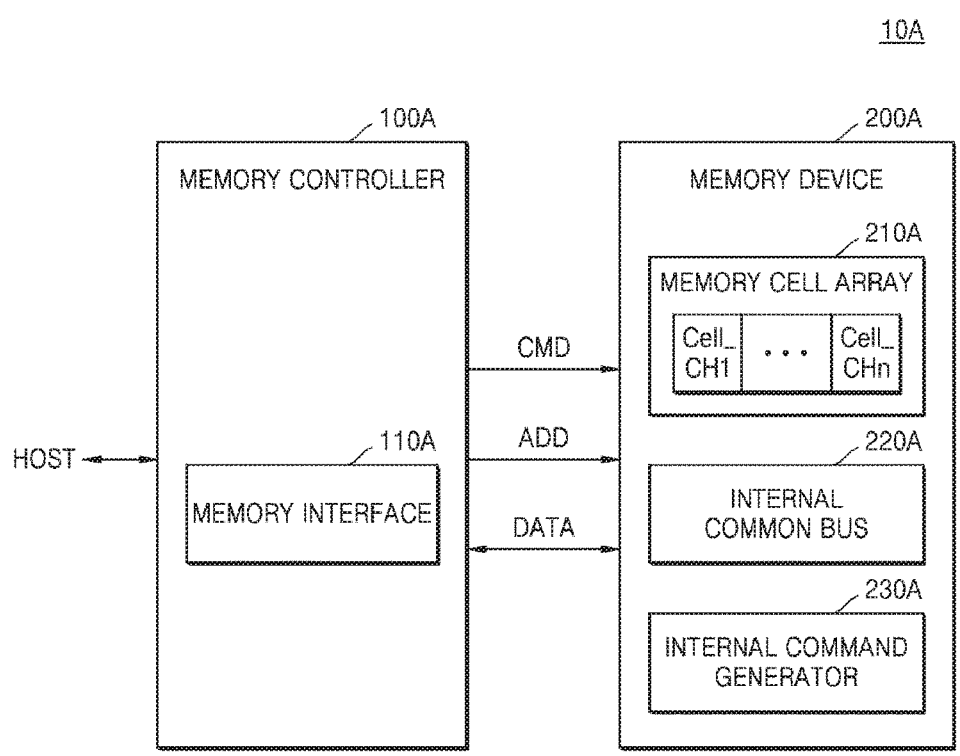
FIG. 1 is a block diagram illustrating an exemplary embodiment of a memory system.

FIG. 1 is a block diagram illustrating an exemplary embodiment of a memory system.

Referring to FIG. 1, a memory system 10A may include a memory controller 100A and a memory device 200A. Memory controller 100A includes a memory interface 110A, and controls memory operations such as write, read, and the like by providing various types of signals to memory device 200A through memory interface 110A. For example, memory controller 100A accesses data DATA of a memory cell array 210A by providing a command CMD and an address ADD to memory device 200A. The command CMD may include a command for a normal memory operation, such as data write, data read, and the like. Further, the command CMD may include a command which requests memory device 200A to perform an internal data processing operation which may include a series of memory operations.

Memory controller 100A may access memory device 200A according to a request from a host HOST. Memory controller 100A may communicate with the host using various protocols. For example, memory controller 100A may communicate with the host using an interface protocol such as peripheral component interconnect express (PCI-E), advanced technology attachment (ATA), serial ATA (SATA), parallel ATA (PATA), or serial attached small computer system interface (SCSI) (SAS). In addition, various other interface protocols such as a Universal Serial Bus (USB), a MultiMedia Card (MMC), an enhanced small disk interface (ESDI), integrated drive electronics (IDE), and the like may be applied to a protocol between the host and memory controller 100A.

Memory device 200A may include the memory cell array 210A, an internal common bus 220A, and an internal command generator 230A. Further, memory device 200A may include n independent channels, and in this case, memory device 200A may include n independent interfaces corresponding to the n independent channels. That is, the independent channels may include independent interfaces, and thus each of the independent channels may operate in the same manner as an individual memory device.

According to one embodiment, memory device 200A may include an independent signal transmission path for each of the independent channels, and thus an independent signal transmission path which delivers a command/an address may be implemented for each of the independent channels and an independent signal transmission path which delivers data may also be implemented for each of the independent channels.

Memory cell array 210A may include a plurality of memory cell groups corresponding to the plurality of independent channels. For example, when memory device 200A includes n independent channels, memory cell array 210A may include n memory cell groups Cell_CH1 to Cell_CHn.

Meanwhile, when memory device 200A has a structure in which a plurality of layers are stacked, memory device 200A may include one or more layers each including memory cells. The layer including the memory cells may be referred to as a core die, and each core die may include a separate independent channel or memory cell group. Further, a single core die may include two or more independent channels or memory cell groups, and in this case, the core die may include a plurality of independent interfaces corresponding to the plurality of independent channels or memory cell groups.

Meanwhile, memory device 200A may be a dynamic random access memory (DRAM) such as a double data rate synchronous DRAM (DDR SDRAM), a low power DDR (LPDDR) SDRAM, a graphics DDR (GDDR) SDRAM, a Rambus DRAM (RDRAM), and the like. However, the embodiments are not limited thereto, and for example, memory device 200A may be implemented as a non-volatile memory such as a flash memory, a magnetic RAM (MRAM), a ferroelectric RAM (FeRAM), a phase change RAM (PRAM), a resistive RAM (ReRAM), and the like.

Meanwhile, internal common bus 220A may include a bus shared by the plurality of memory cell groups for realizing a common internal processing channel which is shared by the plurality of memory cell groups. For example, one or more types of signals may be commonly provided to the plurality of memory cell groups through the common internal processing channel provided by internal common bus 220A. Internal common bus 220A may include a common data bus which commonly provides data to the plurality of memory cell groups. Further, internal common bus 220A may include a common command bus which commonly provides an internal command to the plurality of memory cell groups. According to one embodiment, data of any one memory cell group may be provided to one or more other memory cell groups through the common internal processing channel provided by internal common bus 220A.

According to one embodiment, when the bus shared by the plurality of memory cell groups does not already exist in memory device 200A, internal common bus 220A may be further added in addition to any existing bus for delivering the command/data in memory device 200A. On the other hand, as a test block having a direct access (DA) manner may be provided in memory device 200A, when the bus shared by the plurality of memory cell groups already exists in the test block, internal common bus 220A may correspond to some of existing buses shared by the plurality of memory cell groups.

Internal command generator 230A may generate various types of internal commands related to memory operations, and provide the generated internal commands to the memory cell groups of memory device 200A via the common internal processing channel. For example, various types of commands may be defined between memory controller 100A and memory device 200A and commands which request performing normal memory operations such as write, read, and the like may be defined. According to one embodiment, in the normal memory operations, a command and an address may be independently delivered for each memory cell group in memory device 200A via a corresponding one of the independent channels.

Meanwhile, in a case of a specific command CMD, memory device 200A may perform an internal data processing operation in which a plurality of memory operations may be serially performed in response to the specific command Internal command generator 230A may generate a plurality of internal commands in order to serially perform a plurality of memory operations in response to the reception of the specific command CMD from memory controller 100A. Further, while the internal data processing operation is performed, at least one of a command and data may be delivered to the memory cell groups through the common internal processing channel provided by internal common bus 220A, and thus internal common bus 220A may form a transmission path of the internal command/data between the plurality of memory cell groups while the internal data processing operation is performed.

In order to improve the performance of memory device 200A, various types of internal data processing operations may be performed. For example, as fragmentation occurs in a cell area of memory device 200A, a problem in that a portion of the memory cell area becomes smaller than a minimum unit for writing data, and therefore the portion of the memory cell area may not be used. In this case, as a data copy operation is performed, continuous free memory space may be secured in the memory cell area of memory device 200A, and thus the more efficient use of the memory may be obtained.

In order to perform the above-described internal data processing operation, a copy command CMD for copying data stored in one location of memory device 200A into another location thereof may be defined. When memory device 200A receives the copy command CMD from memory controller 100A, internal command generator 230A may generate a series of internal commands for data copy. When data of a first memory cell group Cell_CH1 is copied into a second memory cell group Cell_CH2, memory device 200A may generate an internal command for reading the data of the first memory cell group Cell_CH1 and an internal command for writing the read data to the second memory cell group Cell_CH2. Further, the data read from the first memory cell group Cell_CH1 may be delivered to the second memory cell group Cell_CH2 through internal common bus 220A.

In a conventional manner, since memory device 200A has a general structure in which interfaces are independent for each independent channel for each memory cell group, in order to perform the data copy operation, the data read from the first memory cell group Cell_CH1 has to be provided to memory controller 100A through a communication path corresponding to the first channel CH1 for memory cell group Cell_CH1, and memory controller 100A has to provide the received data to memory device 200A through a communication path corresponding to the second channel CH2 memory cell group Cell_CH2. On the other hand, according to an embodiment, a series of memory operations for data copy may be performed through the internal data processing operation of memory device 200A without the intervention of memory controller 100A.

Accordingly, in memory system 10A, data processing bandwidth and energy efficiency may be improved and internal power consumption and an operation speed as well as system performance may be improved.

Meanwhile, the data copy operation is illustrated in the above-described embodiment, but the embodiment is not limited thereto. For example, in various types of memory operations such as data move, data swap, read-modify-write (RMW), mask write, and the like, the data may be transmitted and received between the memory cell groups, and the memory operations as described above may be performed through the internal data processing operation using the internal command generation and the common internal processing channel provided by internal common bus 220A of memory device 200A.

Figure 2:
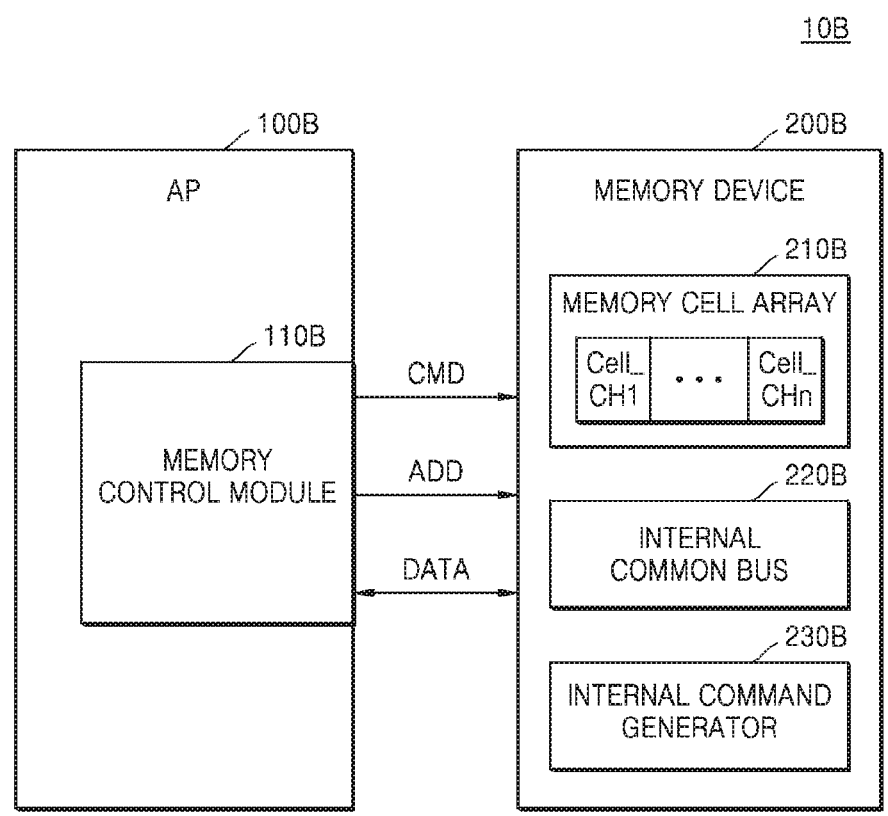
FIG. 2 is a block diagram illustrating another exemplary embodiment of a memory system.

FIG. 2 is a block diagram illustrating another example embodiment of a memory system. In FIG. 2, a data processing system 10B including an application processor 100B and a memory device 200B is illustrated, and a memory control module 110B included in application processor 100B and memory device 200B may constitute a memory system. Further, memory device 200B may include a memory cell array 210B, an internal common bus 220B, and an internal command generator 230B.

Application processor 100B may perform a function of the host in FIG. 1. Further, application processor 100B may be implemented as a system on chip (SoC). The SoC may include a system bus (not illustrated) to which a protocol having a predetermined standard bus specification is applied, and may include various types of intellectual property (IP) cores connected to the system bus. As a standard specification of the system bus, an advanced microcontroller bus architecture (AMBA) protocol of Advanced RISC Machines (ARM) Holdings may be applied. An advanced high-performance bus (AHB), an advanced peripheral bus (APB), an advanced eXtensible interface (AXI), AXI4, AXI coherency extensions (ACE), and the like may be included as a type of the bus of the AMBA protocol. In addition, other type of protocols such as uNetwork of Sonics Inc., Core-Connect of IBM Corp., Open Core Protocol of Open Core Protocol International Partnership Association, Inc. (OCP-IP), and the like may be applied.

Memory control module 110B may perform a function of the memory controller in the above-described embodiment. Further, memory device 200B may perform various types of memory operations through an internal processing operation without the intervention of memory control module 110B. For example, memory device 200B may perform read and write operations for data by generating internal commands, and the data may be transmitted and received between the plurality of memory cell groups through the common internal processing channel provided by internal common bus 220B.

Figure 3:
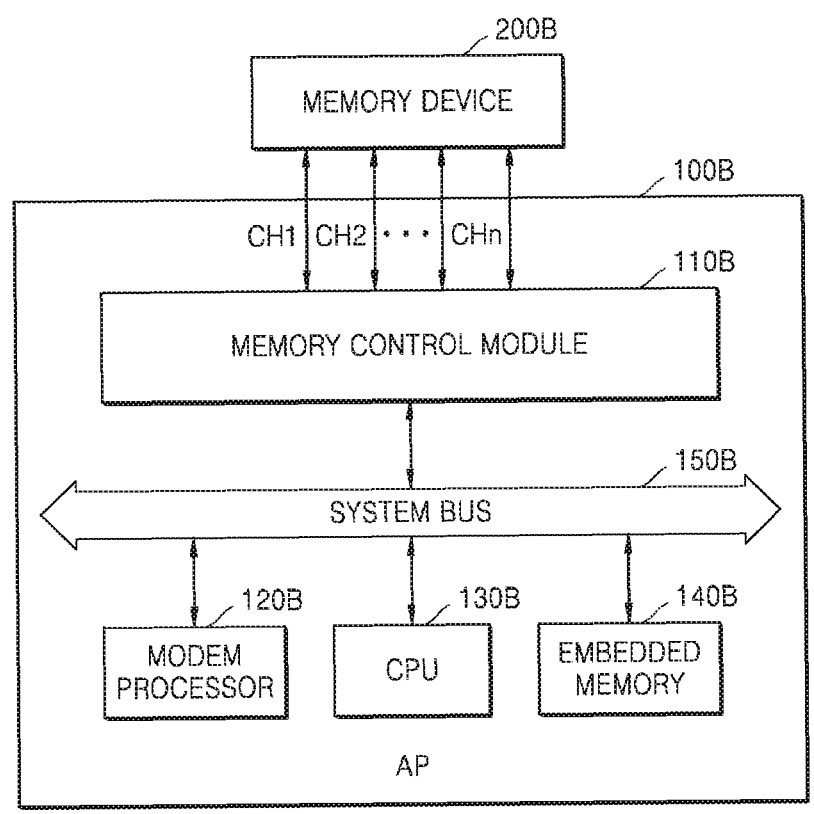
FIG. 3 is a block diagram illustrating an example implementation of an application processor of FIG. 2.

FIG. 3 is a block diagram illustrating an example implementation of application processor 100B of FIG. 2.

Referring to FIGS. 2 and 3, application processor 100B may include a plurality of IP cores connected through a system bus 150B. Application processor 100B may include, for example, a memory control module 110B, a modem processor 120B, a central processing unit (CPU) 130B, and an embedded memory 140B. CPU 130B may control various types of operations of the IP cores inside application processor 100B, and modem processor 120B is a processor for performing wireless communication with a base station or other communication devices.

Meanwhile, memory control module 110B may communicate with memory device 200B disposed outside application processor 100B through a plurality of independent channels corresponding to a plurality of memory cell groups Cell_CH1 to Cell_CHn of memory device 200B. Further, memory control module 110B may communicate with embedded memory 140B through system bus 150B. Embedded memory 140B may also be implemented in the same or similar manner as memory device 200B according to the above-described embodiment, and thus embedded memory 140B may include a common internal processing channel provided by an internal common bus (not illustrated) and an internal command generator (not illustrated).

Figure 4:
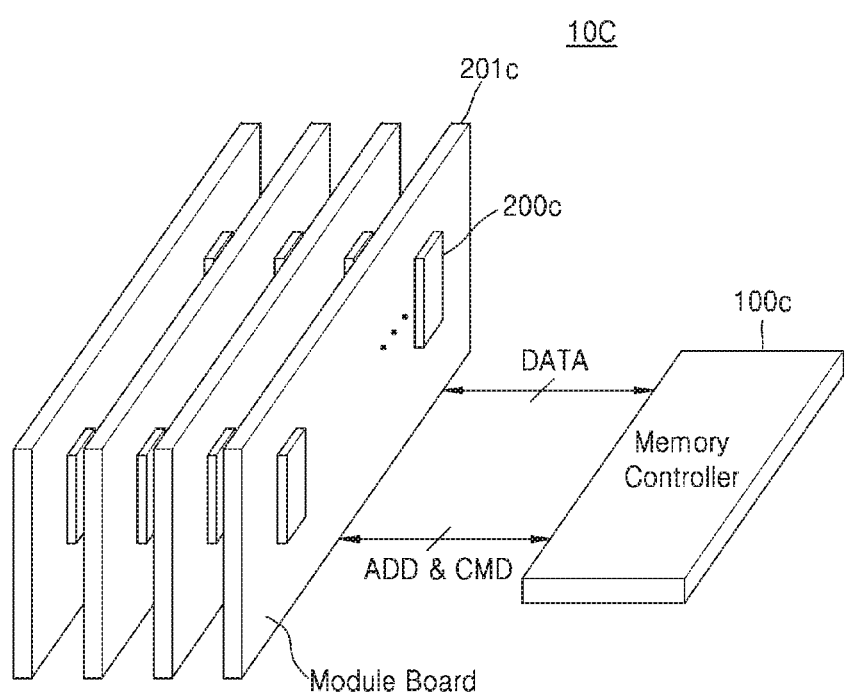
FIG. 4 is a block diagram illustrating another example embodiment of a memory system.

FIG. 4 is a block diagram illustrating another example embodiment of a memory system.

Referring to FIG. 4, a memory system 10C may include a memory controller 100C and one or more memory modules 201C. Each of memory modules 201C includes a module board on which one or more memory devices 200C. Further, memory module 201C may be implemented in a single in-line memory module (SIMM) form or a dual inline memory module (DIMM) form.

The above-described independent channels may be defined in various ways. According to one embodiment, one or more memory modules 201C may include one or more of the above-described independent channels. For example, each of the memory modules 201C may include a single one of the independent channels. Alternatively, a plurality of memory devices 200C may be mounted on each of the memory modules 201C, and each of the memory devices 200C may include a single one of the independent channels. Alternatively, each of the memory devices 200C may include a plurality of memory cell groups, and each of the memory devices 200C may include a plurality of independent channels corresponding to the plurality of memory cell groups.

According to one embodiment, memory system 10C may include the internal common bus (not illustrated) for realizing a common internal processing channel. When each of the memory modules 201C includes a single one of the independent channels for a single memory cell group, a bus shared by the plurality of memory modules 201C may be implemented. Alternatively, when each of the memory devices 200C includes a single one of the independent channels for a single memory cell group, a bus shared by the plurality of memory devices 200C may be implemented in each of the memory modules 201C. Alternatively, when each of the memory devices 200C includes a plurality of independent channels for a corresponding plurality of memory cell groups, a bus shared by the plurality of memory cell groups may be implemented inside each of the memory devices 200C.

Figure 5:
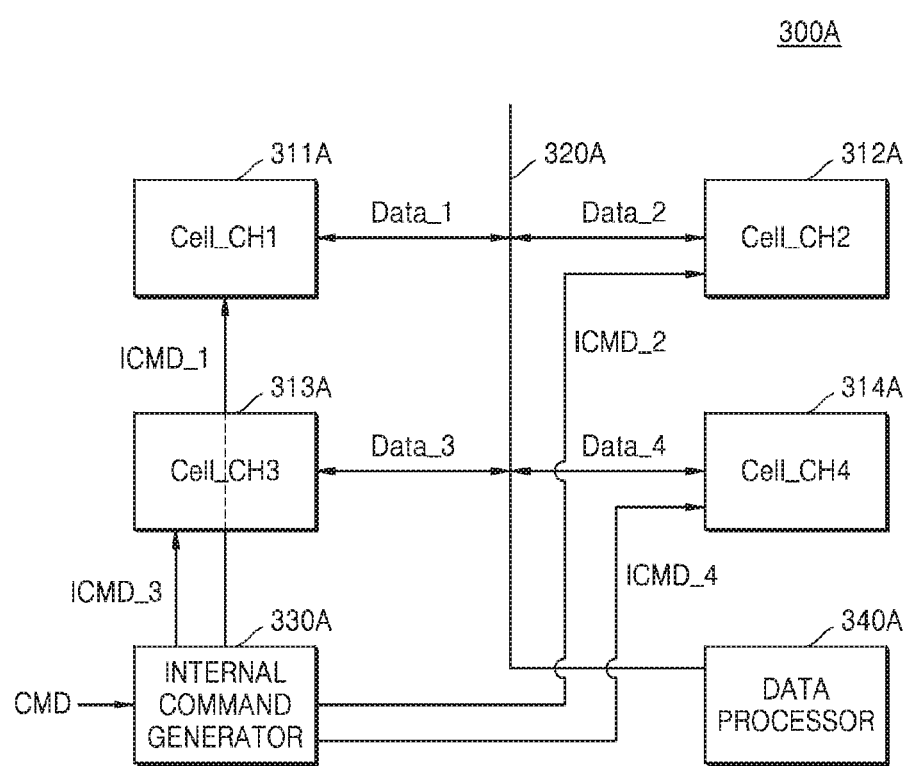
FIGS. 5 and 6 are block diagrams illustrating configurations of example embodiments of a memory device.
Figure 6:
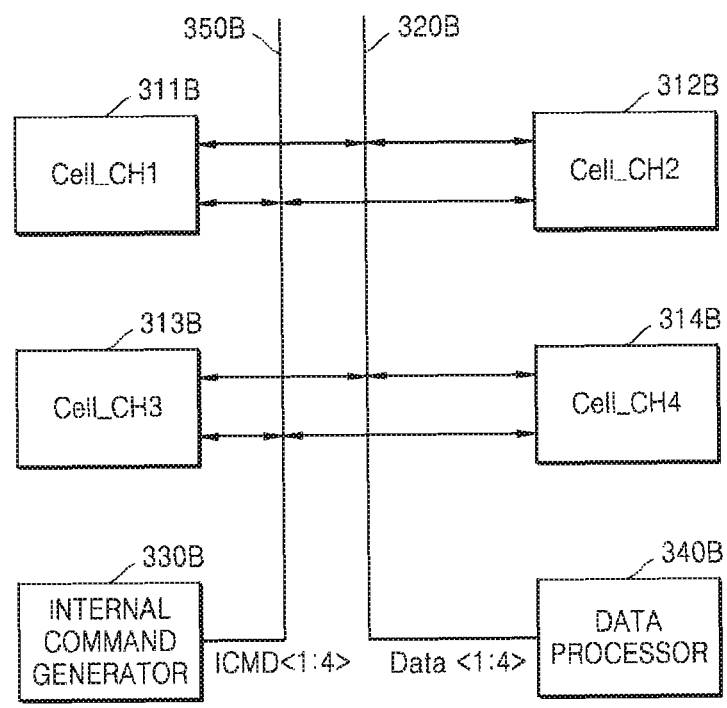

FIGS. 5 and 6 are block diagrams illustrating configurations of example embodiments of a memory device.

Referring to FIG. 5, a memory device 300A may include a plurality of independent channels for a corresponding plurality of memory cell groups Cell_CH1 311A to Cell_CH4 314A. Each of memory cell groups Cell_CH1 311A to Cell_CH4 314A may be defined in various ways. For example, each of memory cell groups Cell_CH1 311A to Cell_CH4 314A may include a cell area, and may be defined to further include one or more components related to memory operations. For example, each of memory cell groups Cell_CH1 311A to Cell_CH4 314A may include a row decoder, a column decoder, a sense amplifier, a command decoder, and the like.

Further, memory device 300A may further include an internal common bus 320A for realizing a common internal processing channel, an internal command generator 330A, and a data processor 340A. Internal common bus 320A may have a signal transmission path shared by the plurality of memory cell groups Cell_CH1 311A to Cell_CH4 314A, and may deliver, for example, data for the plurality of memory cell groups Cell_CH1 311A to Cell_CH4 314A. For example, a first memory cell group Cell_CH1 311A may output first data Data_1 to internal common bus 320A, and the first data Data_1 may be provided to another memory cell group through a common internal processing channel provided by the internal common bus 320A. Similarly, a fourth memory cell group Cell_CH4 314A may output fourth data Data_4 to internal common bus 320A, and the fourth data Data_4 may be provided to another memory cell group through the common internal processing channel provided by internal common bus 320A.

Internal command generator 330A may generate a plurality of internal commands ICMD_1 to ICMD_4 according to a command CMD from a memory controller. For example, independent signal transmission paths for the internal commands may be implemented for the plurality of memory cell groups Cell_CH1 311A to Cell_CH4 314A, and thus internal command generator 330A may provide the internal commands ICMD_1 to ICMD_4 to the memory cell group Cell_CH1 311A to Cell_CH4 314A through the independent paths.

Meanwhile, data processor 340A may be connected to internal common bus 320A, receive data delivered through internal common bus 320A, and perform an internal data processing operation on the received data. For example, data processor 340A may perform a latch operation, a calculation operation, and the like for the data, and output the processed data to internal common bus 320A.

Internal command generator 330A may generate various types of internal commands ICMD_1 to ICMD_4. For example, internal command generator 330A may generate internal commands ICMD_1 to ICMD_4 for performing a change of location for internal data, modification of the internal data, a comparison operation, and the like. Further, internal command generator 330A may generate internal commands ICMD_1 to ICMD_4 for performing RMW, data swap between memory cell groups, mask write, and the like.

Data processor 340A may perform various types of functions related to the internal data processing operation as described above. For example, when a data copy operation or a data swap operation is performed, a function which temporarily stores the data read from any one memory cell group may be performed. Alternatively, when a RMW operation or a mask write operation is performed, a bit comparison operation for the data may be performed and the bit comparison operation may be performed in data processor 340A.

When memory device 300A has a structure in which a buffer die and core dies are stacked, internal common bus 320A may be provided in the buffer die and may transmit and receive data between the plurality of memory cell groups. Alternatively, a plurality of through-silicon-vias (TSVs) for electrically connecting the buffer die to the core dies may be disposed, and internal common bus 320A may correspond to one or more TSVs which deliver data. In particular, each memory cell groups on the core dies may have an independent channel for communication therewith, and the independent channels may each include a corresponding set of the TSVs.

Further, internal command generator 330A and data processor 340A may be implemented in various ways. For example, internal command generator 330A may be included in the buffer die. Further, data processor 340A may be included in the buffer die or in each of the core dies.

Meanwhile, referring to FIG. 6, a memory device 300B may include a plurality of memory cell groups Cell_CH1 311B to Cell_CH4 314B, first and second internal common buses 320B and 350B, an internal command generator 330B, and a data processor 340B. First internal common bus 320B, which is a bus shared by the plurality of memory cell groups Cell_CH1 311B to Cell_CH4 314B, may correspond to a common data bus, and second internal common bus 350B, which is also a bus shared by the plurality of memory cell groups Cell_CH1 311B to Cell_CH4 314B, may correspond to a common command bus. Internal commands ICMD<1:4> for the plurality of memory cell groups Cell_CH1 311B to Cell_CH4 314B generated in internal command generator 330B may be delivered through second internal common bus 350B, and data Data<1:4> for the memory cell groups Cell_CH1 311B to Cell_CH4 314B may be delivered through first internal common bus 320B. Together, first and second internal common buses 320B and 350B may provide a common internal processing channel for memory device 300B.

Figure 7:
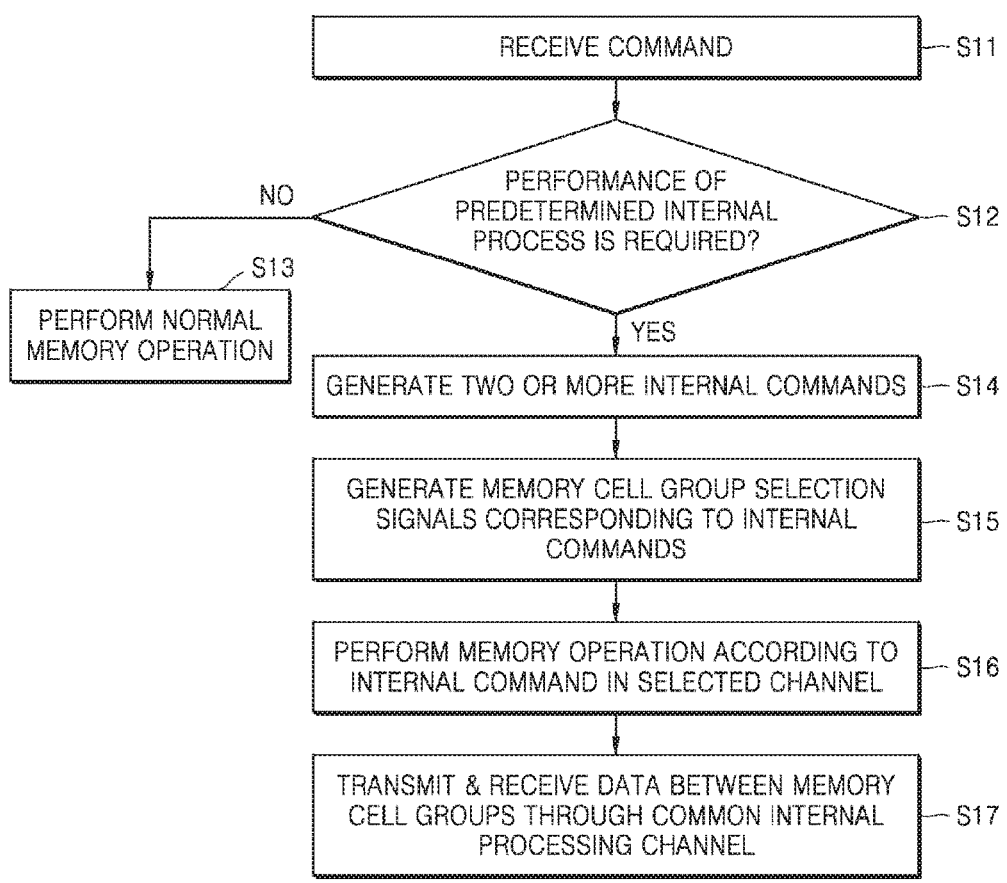
FIGS. 7, 8A, and 8B are flowcharts illustrating an operating method of an example embodiment of a memory device.
Figure 8A:
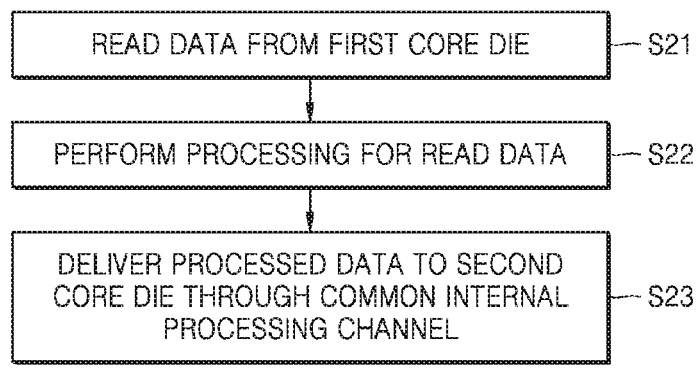
Figure 8B:
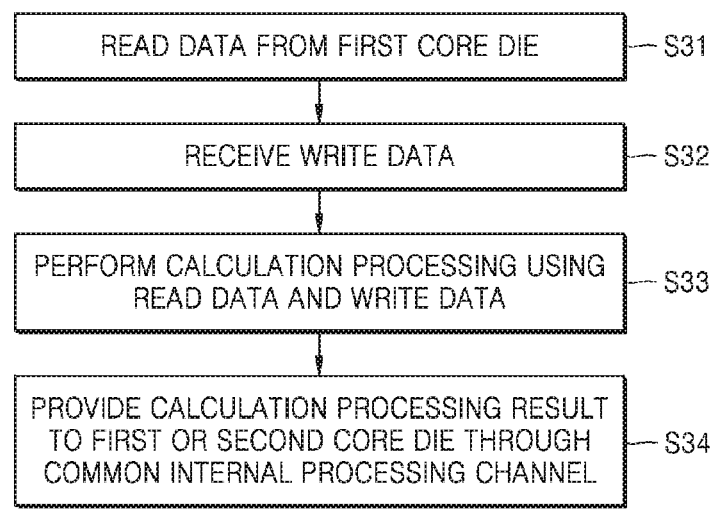

In the embodiment illustrated in FIG. 6, second internal common bus 350B may be implemented in various ways. For example, second internal common bus 350B may be provided in a buffer die and may transmit and receive internal commands between a plurality of memory cell groups. Alternatively, a plurality of TSVs for electrically connecting the buffer die and core dies may be disposed, and second internal common bus 350B may correspond to one or more TSVs which deliver the commands FIGS. 7, 8A, and 8B are flowcharts illustrating an example embodiment of an operating method of a memory device. The memory device may include a plurality of independent channels corresponding to a plurality of memory cell groups, and a common internal processing channel shared by the plurality of memory cell groups.

Referring to FIG. 7, the memory device receives a command from an external memory controller (S11). Various types of commands may be set between the memory controller and the memory device, and some of the commands may correspond to commands which cause the memory device to perform an internal data processing operation, which may include two or more internal memory operations.

The memory device may determine whether the performance of a predetermined internal data processing operation is required through a decoding operation for the received command (S12). When it is determined that the internal data processing operation in which a plurality of memory operations are serially performed is not required, the memory device may complete the operation for the command of the external memory controller by performing a normal memory operation (S13).

On the other hand, according to the specific command received from the memory controller, the memory device may serially generate two or more internal commands (S14). Further, the plurality of memory cell groups may perform different memory operations from each other according to the internal commands, and thus the memory device may generate memory cell group selection signals corresponding to the respective internal commands (S15).

Each of the internal commands and the memory cell group selection signals which are generated in the memory device may be provided to the corresponding memory cell group. The selected memory cell group may perform a memory operation according to the received internal command, and output a result according to the memory operation (e.g., data according to a read operation) (S16). Further, data according to the memory operation may be transmitted and received between the memory cell groups through a common internal processing channel provided by the internal common bus (S17), and for example, data provided in any one memory cell group may be provided to another memory cell groups through the common internal processing channel provided by the internal common bus. The memory cell group which receives the data may perform the memory operation using the received data according to the internal command.

FIGS. 8A and 8B illustrate an example of data delivery when the memory device includes a plurality of layers.

The memory device may include the plurality of layers, and each of the layers may be a die corresponding to a different memory cell group. For example, the memory device may include a single buffer die and a plurality of core dies.

A plurality of internal commands is generated according to a command received from a memory controller, and the memory device performs an internal data processing operation according to the internal commands. An operation in which data is read from a first core die may be performed according to any one internal command (S21).

In order to perform various types of internal processes such as data copy, data swap, RMW, mask write, and the like, an internal data processing operation for the read data may be performed (S22). For example, a temporary latch operation for the read data may be performed as the internal data processing operation. Alternatively, a comparison operation with respect to the read data and various types of data such as write data, mask data, and the like may be performed as the internal data processing operation. Circuits for processing the data may be implemented in various ways, and for example, the circuits for processing the data (e.g., a data processor) may be separately implemented in core dies, or may be shared by the plurality of core dies by being implemented in the buffer die.

According to one embodiment, the processed data may be delivered through a common internal processing channel provided by an internal common bus, and the processed data may be delivered to another core die (e.g., a second core die) (S23). That is, the data may be transmitted and received between the different core dies through the common internal processing channel provided by the internal common bus.

Meanwhile, referring to FIG. 8B, when an internal data processing operation is performed according to a command from a memory controller, an operation in which data is read from a first core die may be performed (S31). Further, write data for RMW, mask write, and the like may be received from the memory controller (S32), and the memory device may perform calculation processing using the data read from the first core die and the received write data (S33). Similar to the above-described embodiment, the calculation processing using the read data and the received write data may be performed in the first core die, in another core die, or in a buffer die.

A result of the calculation processing may be provided to the first core die through the common internal processing channel provided by the internal common bus, or to a second core die having a different memory cell group from the first core die (S34). According to the above-described operations, a series of operations for the internal data processing operation may be performed in the plurality of dies, and the result of the calculation processing may be transmitted and received through the common internal processing channel provided by the internal common bus shared by the memory cell groups.

Hereinafter, embodiments in which each of the memory devices includes a plurality of layers (or, a plurality of dies) having a stacked structure, and examples of various types of internal data processing operations in memory devices having a stacked structure will be described in detail.

Figure 9:
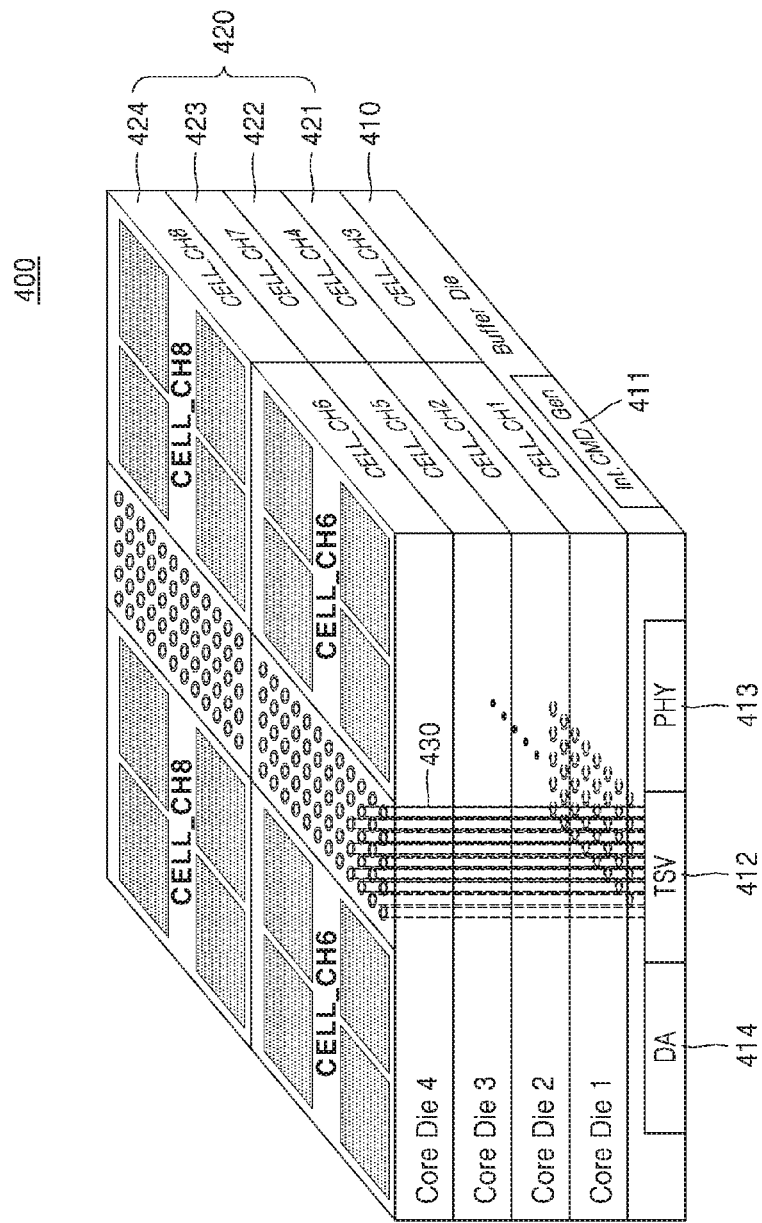
FIG. 9 is a block diagram illustrating a memory device having a stacked structure.

FIG. 9 is a block diagram illustrating an example embodiment of a memory device having a stacked structure. In FIG. 9, a memory device in a high bandwidth memory (HBM) form having an increased bandwidth by including a plurality of independent channels having independent interfaces for a corresponding plurality of memory cell groups is illustrated.

Referring to FIG. 9, a memory device 400 may include a plurality of layers. For example, memory device 400 may include a buffer die 410 and one or more core dies 420 which are stacked on buffer die 410. In the example of FIG. 9, although first to fourth core dies 421 to 424 are illustrated as being provided, the number of the core dies may be variously changed.

Further, each of core dies 420 may include one or more memory cell groups. A single core die 420 includes two memory cell groups in the example of FIG. 9, and thus an example in which the memory device 400 has eight memory cell groups Cell_CH1 to Cell_CH8 is illustrated. For example, a first core die 421 may include a first memory cell group Cell_CH1 and a third memory cell group Cell_CH3, a second core die 422 may include a second memory cell group Cell_CH2 and a fourth memory cell group Cell_CH4, a third core die 423 may include a fifth memory cell group Cell_CH5 and a seventh memory cell group Cell_CH7, and a fourth core die 424 may include a sixth memory cell group Cell_CH6 and an eighth memory cell group Cell_CH8.

Buffer die 410 may communicate with a memory controller, receive a command, an address, and data from the memory controller, and provide the received command, address, and data to core dies 420. Buffer die 410 may communicate with the memory controller through a conductive means (not illustrated) such as bumps and the like which are formed on an outer surface thereof. Buffer die 410 may buffer the command, the address, and the data, and thus the memory controller may interface with core dies 420 by driving only a load of buffer die 410.

Further, memory device 400 may include a plurality of TSVs 430 passing through the layers. TSVs 430 may be disposed corresponding to the plurality of memory cell group Cell_CH1 to memory cell group Cell_CH8, and TSVs 430 may include components for inputting and outputting 1024-bit data when each of the independent channels for the corresponding memory cell groups has a 128-bit bandwidth.

According to one embodiment, at least some of TSVs 430 may be used as the internal common bus for a common internal processing channel, as described in the above-described embodiment. For example, TSVs 430 may be disposed to pass through first to fourth core dies 421 to 424, and each of first to fourth core dies 421 to 424 may include a transmitter/a receiver connected to the TSVs 430. When a normal operation in which the inputting and outputting of the data is independently performed for each memory cell group, only the transmitter/receiver of any one core die may be enabled, with respect to each of TSVs 430, and thus each of the TSVs 430 may independently deliver only the data of any one core die, any one memory cell group, as an independent channel for that one core die or memory cell group.

Meanwhile, according to an embodiment, when TSVs 430 are used as the above-described internal common bus for a common internal processing channel to perform an internal data processing operation, such as data copy, data swap, and the like, the transmitters/the receivers of two or more core dies may be sequentially or simultaneously enabled with respect to each of TSVs 430, and thus the data may be transmitted and received between at least two memory cell groups.

Buffer die 410 may include an internal command generator 411, a TSV area 412, a physical (PHY) area 413, and a DA area 414. Internal command generator 411 may generate internal commands according to the above-described embodiments and provide the generated internal commands to core dies 420 through TSVs 430. TSV area 412 is an area in which TSVs 430 for communicating with core dies 420 are formed. Further, physical area 413 is an area including a plurality of input-and-output (IO) circuits for communicating with an external memory controller, and various types of signals from the memory controller may be provided to TSV area 412 through physical area 413 and to core dies 420 through TSVs 430.

Meanwhile, DA area 414 may directly communicate with an external tester in a test mode for memory device 400 through a conductive means which is disposed on an outer surface of memory device 400. Various types of signals provided from the tester may be provided to core dies 420 through DA area 414 and TSV area 412. Alternatively, as a modifiable embodiment, various types of signals provided from the tester may be provided to core dies 420 through DA area 414, physical area 413, and TSV area 412.

Figure 10:
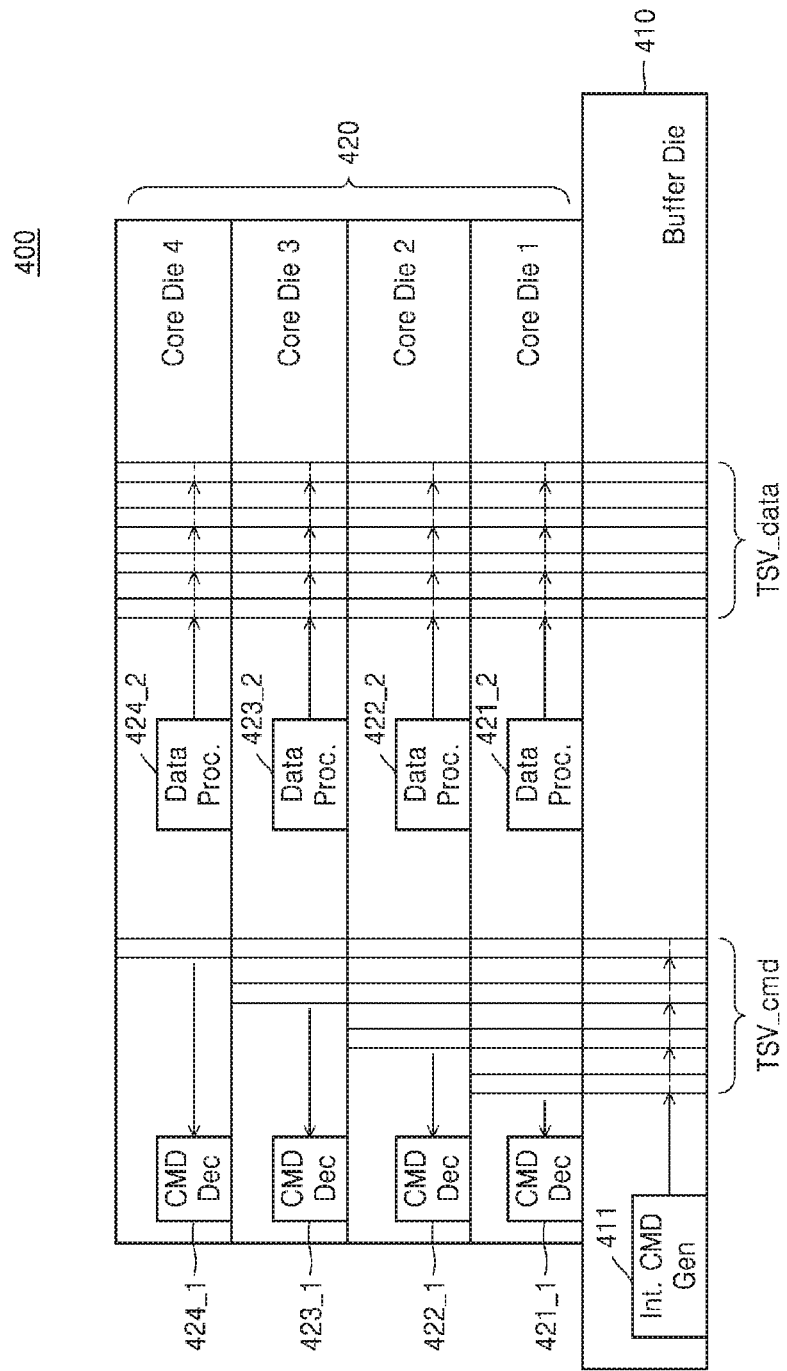
FIG. 10 is a diagram illustrating an example of an internal data processing operation in the memory device of FIG. 9.

FIG. 10 is a diagram illustrating an example of an internal processing operation in the memory device of FIG. 9.

Referring to FIGS. 9 and 10, buffer die 410 includes internal command generator 411, and the internal commands from internal command generator 411 are provided to core dies 420 through command TSVs TSV_cmd which are independently formed for each memory cell group. Buffer die 410 may control the memory operations of core dies 420 by outputting the internal commands Meanwhile, core dies 420 may respectively include command decoders 421_1 to 424_1 which output internal control signals by decoding internal commands, and data processors 421_2 to 424_2 which perform processing operations for read data and/or data to be written.

Referring to any one core die (e.g., a first core die 421), first core die 421 may perform a memory operation according to a decoding result of command decoder 421_1, and for example, data of a plurality of bits stored in a memory cell area inside first core die 421 may be read and provided to data processor 421_2. Data processor 421_2 may process the data of the plurality of bits in parallel, and output the data processed in parallel to a plurality of data TSVs TSV_data in parallel.

According to a type of the memory operation, data processor 421_2 may temporarily store the read data, and output the stored data to a data TSV TSV_data. Further, according to the control of command decoder 421_1, the data from data processor 421_2 may be provided to at least one of the other core dies through the data TSV TSV_data. When an internal data processing operation is performed in which data of first core die 421 is copied into second core die 422, the data from data processor 421_2 may be provided to second core die 422 through the data TSV TSV_data.

Figure 11:
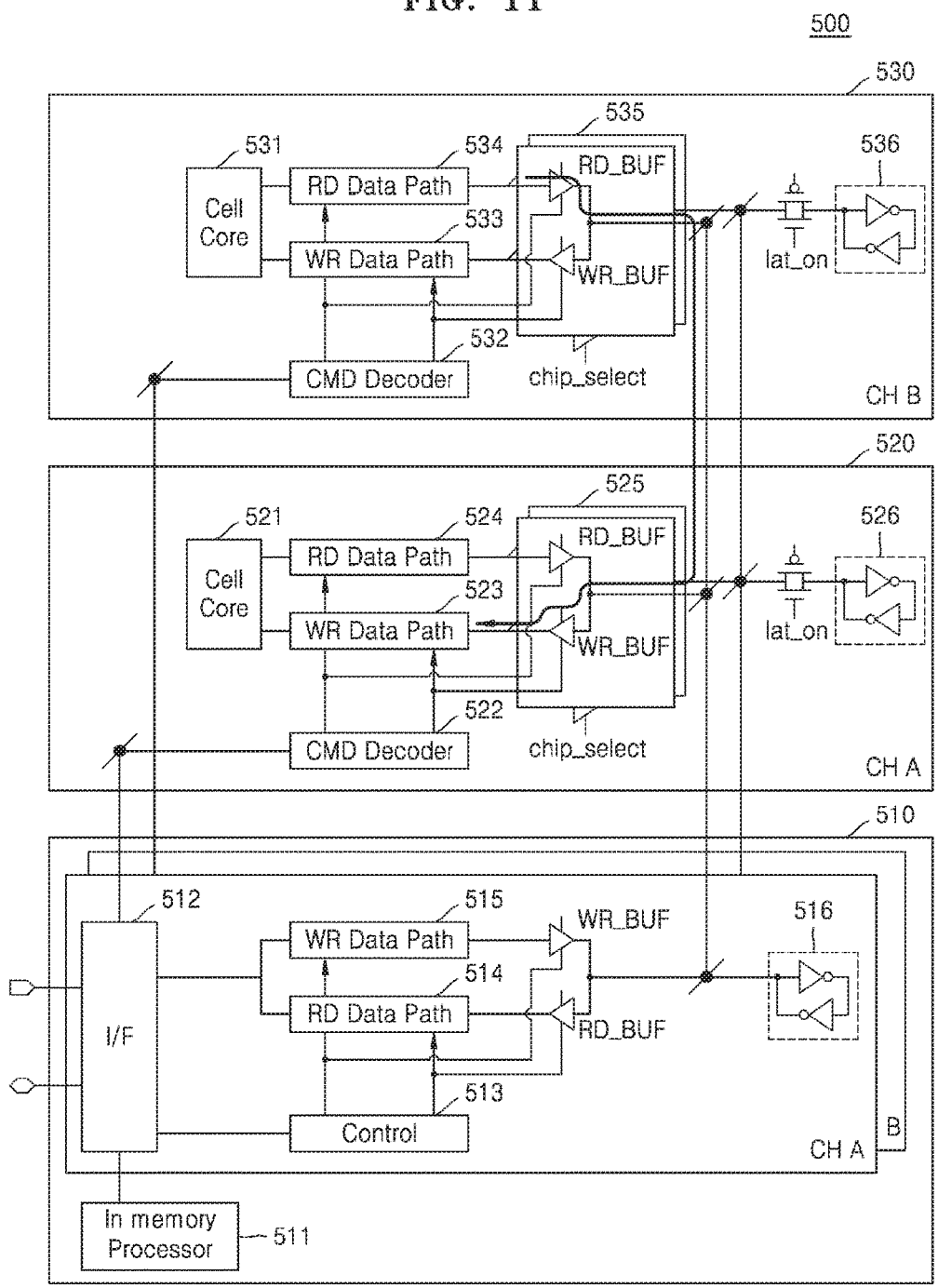
FIG. 11 is a block diagram illustrating an example in which data copy is performed in an example embodiment of a memory device.

FIG. 11 is a block diagram illustrating an example in which a data copy operation is performed in an example embodiment of a memory device. Hereinafter, operations of a single buffer die and two core dies are illustrated for convenience of description. Further, an in-memory processor illustrated in the following embodiments may perform a command decoding function in the above-described embodiment. Further, the in-memory processor may further perform a function in which a chip selection signal chip_select for selection of a memory cell group or chip is provided according to the internal data processing operation. According to a modifiable embodiment, the chip selection signal chip_select illustrated in the following drawings may be implemented to be generated through the command decoder of each of the core dies.

Referring to FIG. 11, a memory device 500 may include a buffer die 510 and first and second core dies 520 and 530. First core die 520 may include an $A^{th}$ channel CH A for an $A^{th}$ memory cell core or group 521, and second core die 530 may include a $B^{th}$ channel CH B for a $B^{th}$ memory cell core or group 531.

Buffer die 510 may communicate with a memory controller, generate internal commands for performing a series of internal data processing operations in response to a specific command from the memory controller, and provide the internal commands to first and second core dies 520 and 530 while changing the chip selection signal chip_select for selecting the core die. Further, data may be transmitted and received between buffer die 510 and first and second core dies 520 and 530, and data TSVs for transmitting and receiving the data may be commonly disposed in buffer die 510 and first and second core dies 520 and 530.

Buffer die 510 may include a plurality of input/output (I/O) circuits in order to independently perform interfacing with the $A^{th}$ channel and $B^{th}$ channel for first and second core dies 520 and 530. For example, buffer die 510 may include an I/O circuit for the $A^{th}$ channel CH A for an $A^{th}$ memory cell core or group 521 which interfaces with first core die 520 and an I/O circuit for the $B^{th}$ channel CH B for a $B^{th}$ memory cell core or group 531 which interfaces with second core die 530. Various components provided in each of the I/O circuits may be disposed in at least one area of buffer die 510, and for example, the components of each of the I/O circuits may be disposed in a physical area.

Buffer die 510 may include an in-memory processor 511 for generating the internal commands according to the above-described embodiment. According to one embodiment, in-memory processor 511 may be a component shared by a plurality of memory cell groups. Further, the I/O circuit corresponding to each of the channels for each of the memory cell groups may include an interface 512 which interfaces with the memory controller, a path controller 513, a read data path 514, a write data path 515, and one or more latches 516.

In-memory processor 511 may serially output the plurality of internal commands so that the internal data processing operation according to the command from the memory controller is performed. Further, each of the core dies may perform a predetermined function according to the internal command, and in-memory processor 511 may select the core die in which a function according to the internal command will be performed by outputting a chip selection signal chip_select. First and second core dies 520 and 530 may include transceivers 525 and 535, respectively, which input and output data through data TSVs, and the transceiver of each of the core dies may be controlled to be enabled by the chip selection signal chip_select.

Meanwhile, first core die 520 may include $A^{th}$ memory cell core or group 521 including a cell area, a command decoder 522 which decodes an internal command, a write data path 523, a read data path 524, and transceiver 525. Further, first core die 520 may further include a circuit for performing predetermined processing for data to be written and/or read data. For example, a data processor 526, which performs a processing operation which controls the delivery of the data or temporarily stores the data, is illustrated in FIG. 11. Data processor 526 may include latches, and a switch for controlling electrical connection with a data TSV.

Second core die 530 may be implemented in the same or similar manner as first core die 520, and thus second core die 530 may include $B^{th}$ memory cell core or group 531, a command decoder 532, a write data path 533, a read data path 534, transceiver 535, and a data processor 536. Data processor 536 may also include latches and a switch.

According to the command from the external memory controller, an internal data processing operation for copying data of second core die 530 into first core die 520 may be performed, and the internal process may be performed by generating an internal command inside memory device 500 without the intervention of the memory controller. For example, buffer die 510 may provide the internal command to second core die 530, and second core die 530 may read data in response to the received internal command and provide the read data to first core die 520 through the data TSV serving as an internal common bus. Further, buffer die 510 may provide the internal command to first core die 520, and first core die 520 may write the data, which is received through the data TSV in response to the internal command, to $A^{th}$ memory cell core or group 521. Thus, the data of second core die 530 may be copied into $A^{th}$ memory cell core or group 521 of first core die 520.

According to a modifiable embodiment, the data read from second core die 530 may be stored in the latches of data processor 536, and the data stored in the latches of data processor 536 may be provided to first core die 520 through the data TSV.

According to the above-described embodiment, even when a memory operation in which data moves between different core dies or memory cell groups is performed, the copy operation of the data between the memory cell groups may be performed through the internal data processing operation of memory device 500 without the intervention of the memory controller.

Figure 12A:
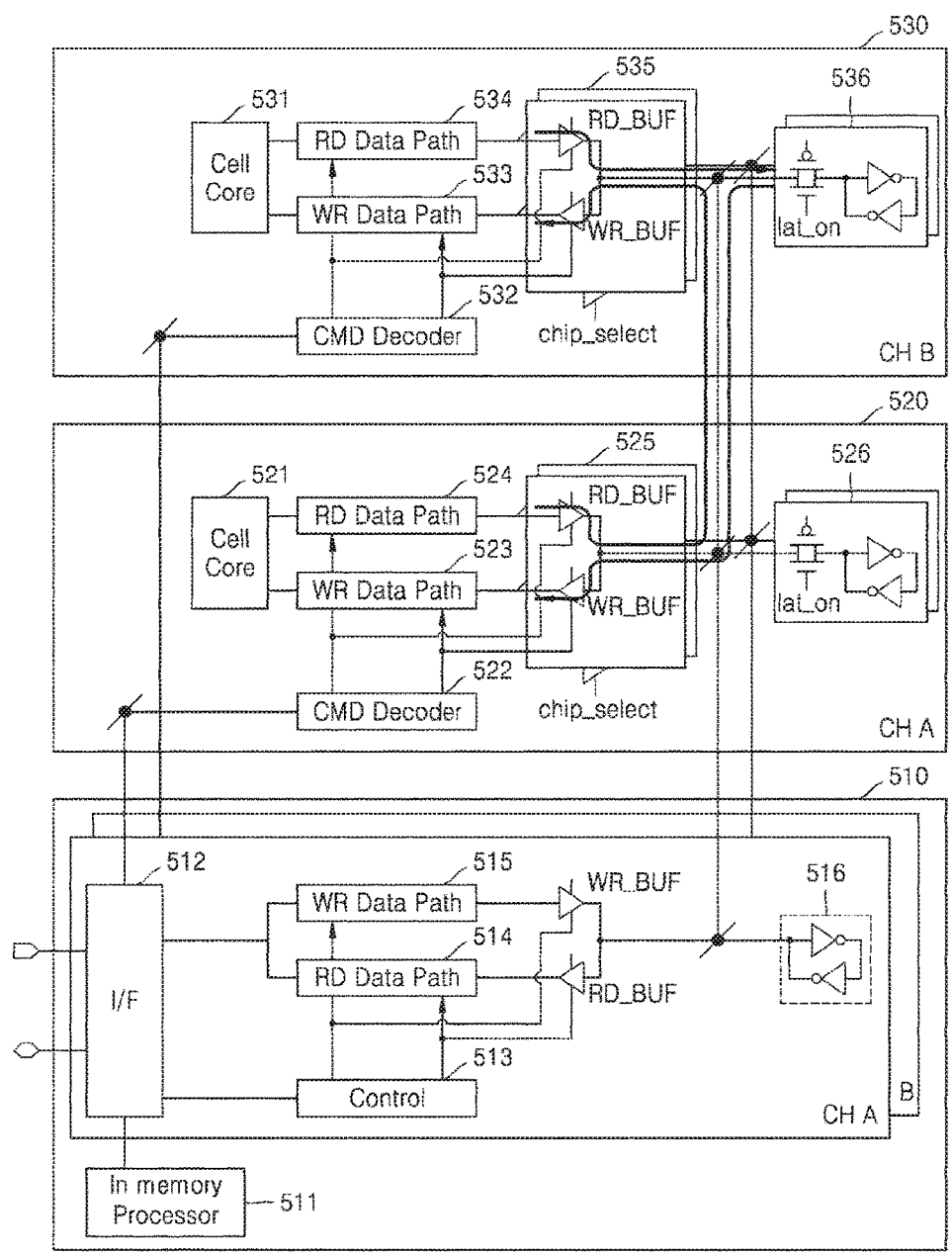

FIGS. 12A and 12B are block diagrams illustrating an example in which a data swap operation is performed in an example embodiment of a memory device. Since components of memory device 500 illustrated in FIG. 12A are the same as or similar to the components of memory device 500 in the above-described embodiment of FIG. 11, repeated description of the components illustrated in FIG. 12A will be omitted.

Referring to FIGS. 12A and 12B, according to the command from the external memory controller, an internal data processing operation for swapping data of first core die 520 with data of second core die 530 may be performed, and buffer die 510 may generate a series of internal commands for the data swapping and provide the series of internal commands to first and second core dies 520 and 530. Further, in-memory processor 511 may select a core die which will perform a function according to the internal command by outputting the chip selection signal chip_select.

As an example of the internal data processing operation for swapping data, referring to FIG. 12B, first, data of first core die 520, i.e. data of $A^{th}$ memory cell core or group 521, corresponding to a first channel CH A is read according to the internal command (CH A RD), and the read data is stored in the latches of data processor 526 of first core die 520. After the data of first core die 520 is stored in the latches of data processor 526, the switch of data processor 526 may be turned off in order to block an electrical connection of the latches and the data TSV which delivers the data (CH A lat_off).

Further, data of second core die 530, i.e. data of $B^{th}$ memory cell core or group 531, corresponding to a second channel CH B is read according to the internal command (CH B RD), and the data read from second core die 530 is provided to first core die 520 through the data TSV serving as an internal common bus. Further, the data provided to first core die 520 is written in $A^{th}$ memory cell core 521 of first core die 520 according to the internal command (CH A WR). Then, when the switch of data processor 526 of first core die 520 is turned on (CH A lat_on), the data read from first core die 520 is provided to second core die 530 through the data TSV serving as an internal common bus, and the data provided to second core die 530 is written in $B^{th}$ memory cell core or group 531 of second core die 530 according to the internal command (CH B WR).

As described above, even when the data of different memory cell groups are swapped, data read from any one memory cell group may be provided to another memory cell group through the common internal processing channel provided by the internal common bus without the intervention of the memory controller, and thus the data swap between the memory cell group may be performed through an internal data processing operation of the memory device without increasing an access frequency of a system to the memory device.

Figure 13A:
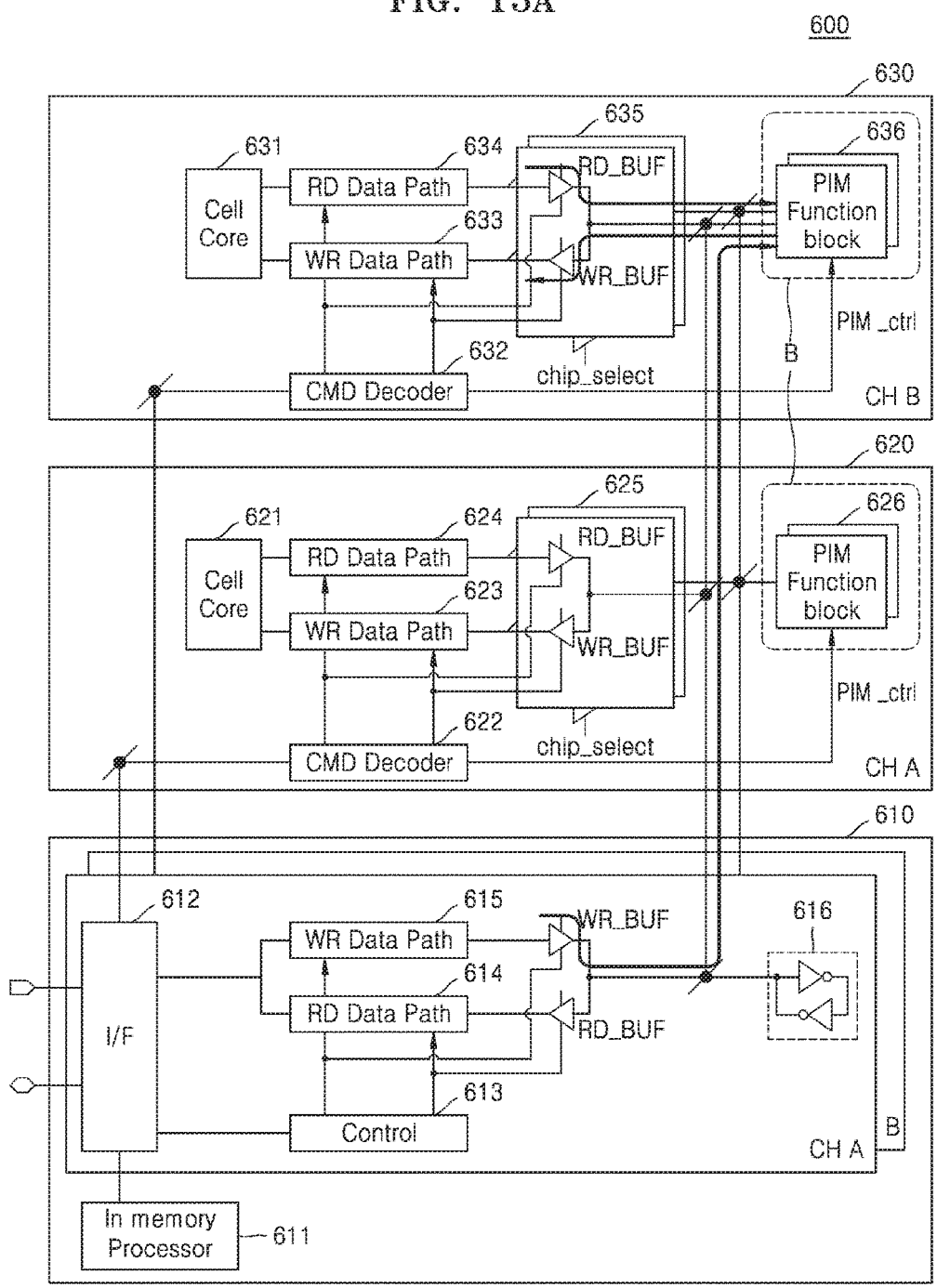
Figure 13B:
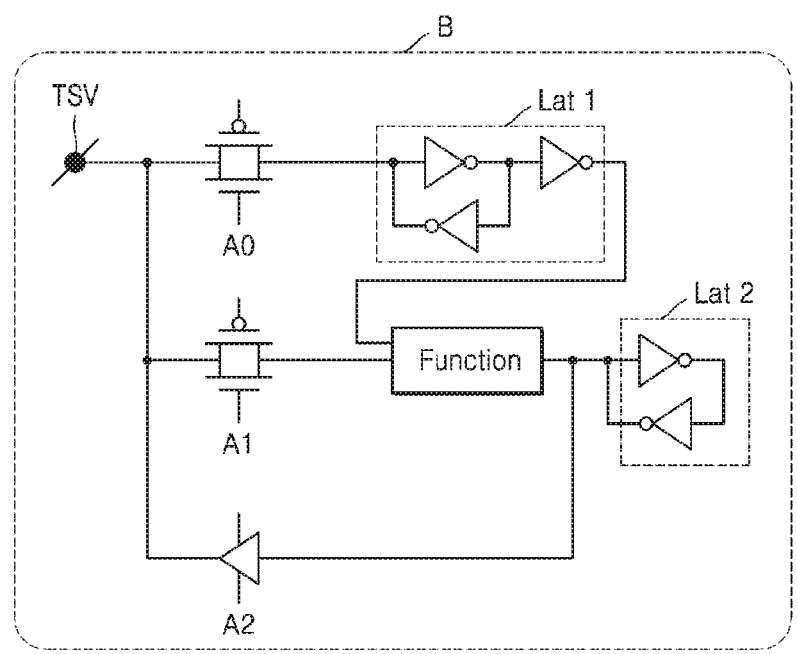

FIGS. 13A to 13C are block diagrams illustrating an example in which a RMW operation is performed in an example embodiment of a memory device. Since components of a memory device 600 illustrated in FIG. 13A are the same as or similar to the components of memory device 500 in the above-described embodiment of FIGS. 11, 12A, and 12B, repeated description of each of the components illustrated in FIG. 13A will be omitted.

Referring to FIGS. 13A to 13C, memory device 600 may include a buffer die 610 and first and second core dies 620 and 630 serving as one or more core dies, first and second core dies 620 and 630 may include different channels, Channel A and Channel B respectively, and corresponding memory cell cores or groups 621 and 631, and buffer die 610 may include I/O circuits corresponding to the respective channels. Buffer die 610 may include an in-memory processor 611, and each of the I/O circuits may include an interface 612, a path controller 613, a read data path 614, a write data path 615, and one or more latches 616. In-memory processor 611 may perform various control functions related to an internal data processing operation, and for example, in-memory processor 611 may perform an operation which generates an internal command. Further, in-memory processor 611 may further generate a chip selection signal chip_select for selecting a core die which will perform the memory operation according to the internal command Further, first core die 620 may include memory cell core or group 621 including a cell area, a command decoder 622 which decodes an internal command, a write data path 623, a read data path 624, and a transceiver 625. Further, first core die 620 may include a processor in memory (PIM) function block 626 which performs calculation processing for data to be written and/or read data. Access such as data write, data read, and the like to memory cell core or group 621 may be performed in parallel with respect to a plurality of bits, and thus a plurality of transceivers 625 and a plurality of PIM function blocks 626 corresponding to plurality of transceivers 625 may be included in first core die 620.

In one embodiment, an operation of PIM function block 626 may be controlled in accordance with various ways, and for example, PIM function block 626 may be controlled by a PIM control signal PIM_ctrl according to a decoding result of the internal command.

Further, second core die 630 may be implemented in the same or similar manner as first core die 620, and thus second core die 630 may include memory cell core or group 631, a command decoder 632, a write data path 633, a read data path 634, a transceiver 635, and a PIM function block 636. According to the types of internal commands provided to the core dies, PIM function block 626 of first core die 620 and PIM function block 636 of second core die 630 may perform different functions from each other.

PIM function blocks 626 and 636 may perform calculation processing for data by being implemented in various ways. According to one embodiment, each of PIM function blocks 626 and 636 may include a function unit which performs a Boolean function, and may perform a function such as AND, OR, XOR, NOT, and the like with respect to the data. In an example implementation, as illustrated in FIG. 13B, each of PIM function blocks 626 and 636 may include one or more switches A0 and A1, one or more latches Lat 1 and Lat 2, a function unit, and a buffer A2. The function unit may perform the above-described Boolean function.

As an example of an RMW operation, when data is written in one area of a memory cell core, the data stored in the area is read, and then a bit value of the read data is compared with a bit value of data to be written. Then, the data in which the bit value of the read data is different from the bit value of the data to be written may be selectively written in the area of the memory cell core according to a comparison result.

Referring to FIG. 13C, when the RMW operation is performed in one area of memory cell core or group 631 of second core die 630, data in the area of memory cell core or group 631 is read (CH B RD), and the read data is stored in the latch Lat 1 by passing through the first switch A0 of PIM function block 636. After the data is stored in the latch Lat 1, the first switch A0 is turned off (A0 Off) and the second switch A1 is turned on (A1 On).

Further, the write data to be written in the area of memory cell core or group 631 is provided to second core die 630 through a data TSV serving as an internal common bus (Data_WR). Since a comparison operation for the write data is performed before the write data is written in cell core 631, a receiver (or, a write buffer) may be in an off state (WR Buf Off). The write data is provided to the function unit by passing through the second switch A1 of PIM function block 636. The function unit performs a comparison operation with respect to the data read from the area of memory cell core or group 631 and the write data. Further, a comparison result is temporarily stored in the latch Lat 2.

Only some bits of the write data may be selectively written in the area of memory cell core or group 631 according to the comparison result. The second switch A1 may be turned off (A1 Off), the buffer A2 may be activated (A2 On), and data in which the bit value of the read data is different from the bit value of the data to be written may be provided to memory cell core or group 631 through the buffer A2. Accordingly, a write operation for some bits of the write data may be selectively performed (CH B WR).

Figure 14A:
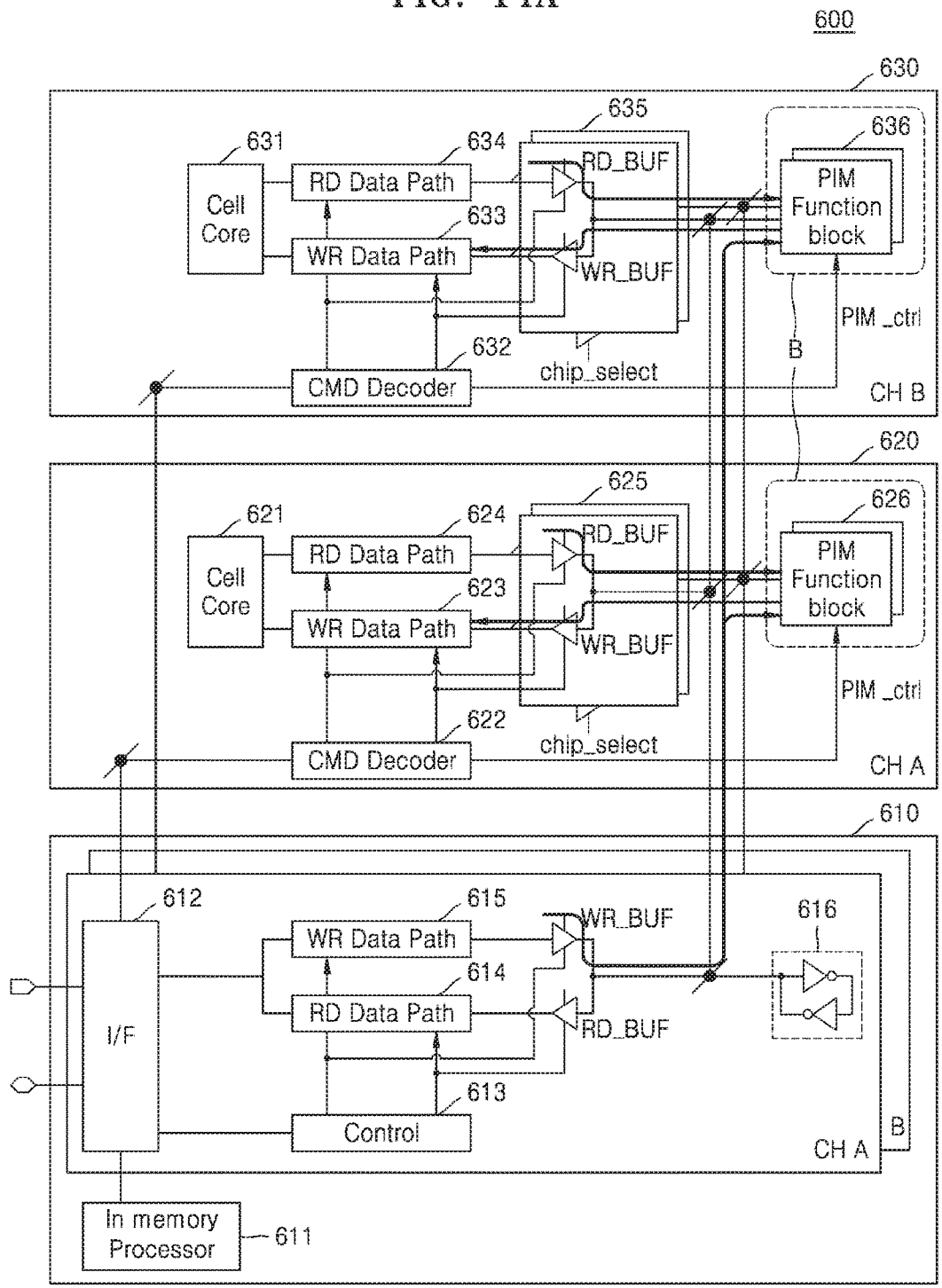

FIGS. 14A and 14B are block diagrams illustrating an example in which RMW operations are simultaneously performed on two or more memory core dies in an example embodiment of the memory device. Since components of memory device 600 illustrated in FIG. 14A are the same as or similar to the components of memory device 600 in the above-described embodiment of FIG. 13A, repeated description of each of the components illustrated in FIG. 14A will be omitted.

Referring to FIGS. 14A and 14B, the write data may be simultaneously written in first and second core dies 620 and 630 according to an RMW operation, and first, data in the area of memory cell core or group 631 of second core die 630 may be read (CH B RD). The data read from memory cell core or group 631 is stored in the latch Lat 1 by passing through the first switch A0 (see FIG. 13B) of PIM function block 636. After the data is stored in the latch Lat 1, the first switch A0 is turned off (CH B A0 Off). Further, data in the area of memory cell core or group 621 of first core die 620 may be read (CH A RD). The data read from memory cell core or group 621 is stored in the latch Lat 1 by passing through the first switch A0 of PIM function block 626, and the first switch A0 is turned off (CH A A0 Off) after the data is stored in the latch Lat 1.

Then, second switches A1 of all the channels may be turned on (All CH A1 On) and receivers (or, write buffers) of all the channels may be turned off (WR Buf Off). Further, the write data is provided to first core die 620 and second core die 630 through the data TSV serving as an internal common bus (Data_WR). As the write data is provided to the function unit, a comparison operation with respect to the read data and the write data may be performed similar to the above-described embodiment, and the second switches A1 of all the channels may be changed to an off state (All CH A1 Off).

Then, at least some bits of the write data may be written in each of first core die 620 and second core die 630 according to a comparison result. For example, the buffer A2 of first core die 620 is enabled (CH A A2 On), and at least some bits of the write data are written in memory cell core or group 621 of first core die 620 (CH A WR). Further, the buffer A2 of second core die 630 is enabled (CH B A2 On), and at least some bits of the write data are written in memory cell core or group 631 of second core die 630 (CH B WR).

According to the embodiment, when the RMW operation is performed with respect to at least two core dies, the write data may be simultaneously provided to at least two core dies through the internal common bus without the intervention of the memory controller, and thus the RMW operation may be simultaneously performed with respect to the two core dies.

Figure 15A:
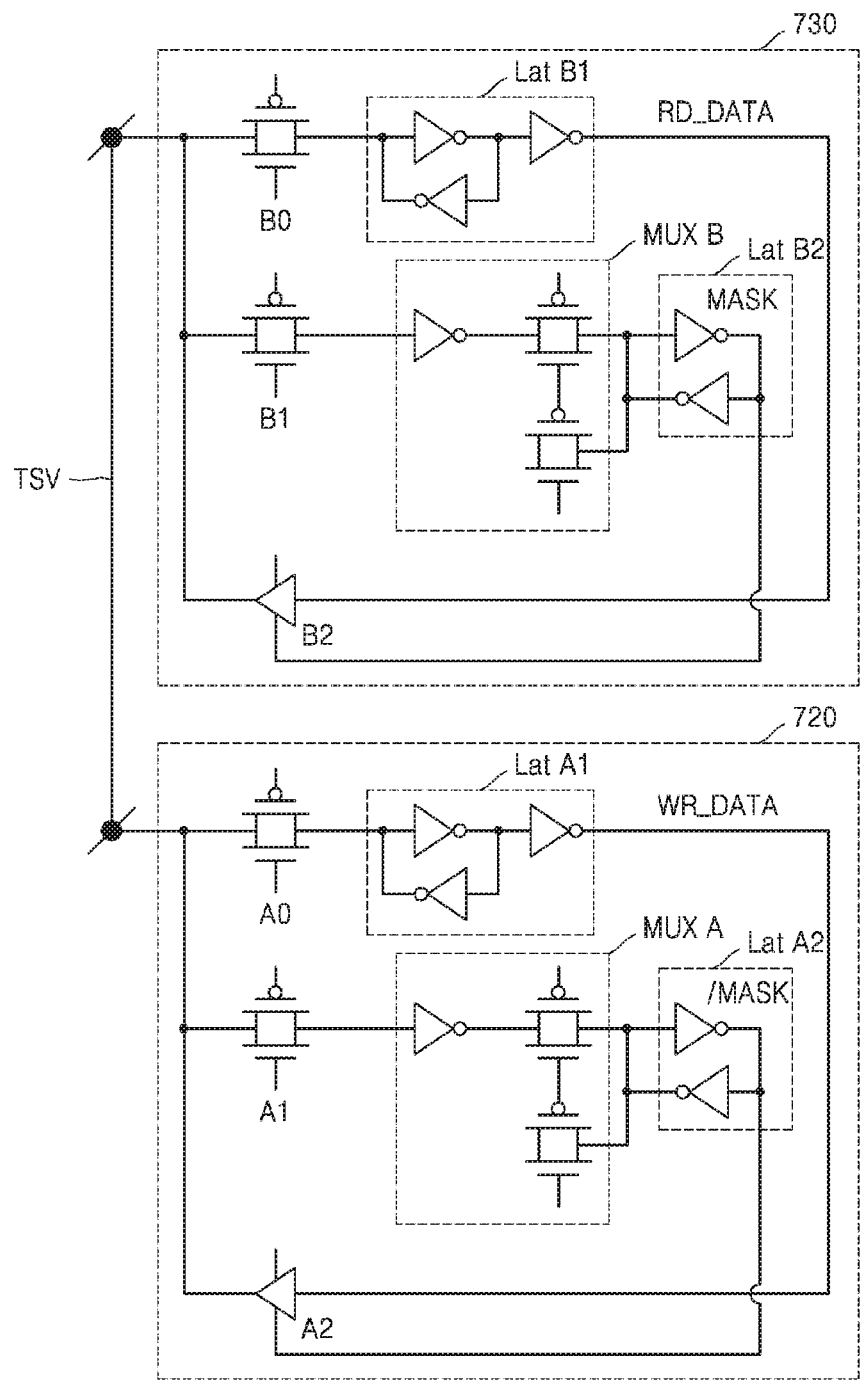

FIGS. 15A and 15B are block diagrams illustrating an example in which a mask write is performed in an example embodiment of a memory device. In FIGS. 15A and 15B, only PIM function blocks included in core dies of the memory device are illustrated for convenience of description.

When the mask write is performed, the memory controller may provide write data and mask data corresponding to the write data. For example, a value of mask data corresponding to each of a plurality of bits included in the write data may be set to logic high or logic low, and a write operation may be selectively performed for only data of which a value of the mask data is logic low. Further, when the mask write is performed, since some pieces of data are maintained in a previous write state according to the value of the mask data, an internal read operation may be performed in advance before the write operation is performed.

Referring to FIGS. 15A and 15B, a memory device 700 may include a buffer die and one or more core dies (not illustrated as described above), a first core die may include a first PIM function block 720, and a second core die may include a second PIM function block 730. First PIM function block 720 may include one or more switches A0 and A1, one or more latches Lat A1 and Lat A2, a buffer A2, and a multiplexer MUX A. Further, second PIM function block 730 may include one or more switches B0 and B1, one or more latches Lat B1 and Lat B2, a buffer B2, and a multiplexer MUX B.

A case in which a mask write is performed in the second core die corresponding to a channel B is illustrated. First, as a mask write command is received from the memory controller, data may be read from a cell core of the second core die according to an internal data processing operation of memory device 700 (CH B RD), and the read data may be stored in the latch Lat B1 of second PIM function block 730. After the read data is stored in the latch Lat B1, the first switch B0 may be turned off (CH B B0 Off).

Further, receivers (or, write buffers) of all the channels are turned off (WR Buf Off), and the write data is provided to the memory device (Data_WR). The write data may be provided to the first core die through the data TSV corresponding to an internal common bus, and may be stored in the latch Lat A1 of first PIM function block 720. After the write data is stored in the latch Lat A1, the first switch A0 of first PIM function block 720 may be turned off (CH A A0 Off).

Further, the second switches A1 and B1 of all the channels may be turned on (All CH A1, B1 On), and the mask data from the memory controller may be provided to the memory device (Data_mask). The mask data may be stored in the latch Lat A2 through the multiplexer MUX A of first PIM function block 720 and may be stored in the latch Lat B2 through the multiplexer MUX B of second PIM function block 730. According to one embodiment, each of bits of the mask data may be stored in the latch Lat A2 by inverting values of the bits of the mask data in the first PIM function block 720, and each of the bits of the mask data may be stored in the latch Lat B2 without inverting of the values of the bits of the mask data in second PIM function block 730.

Then, according to the values of the bits of the mask data, the write data stored in first PIM function block 720 may be provided to the memory cell core or group of the second core die of a write target, or the read data stored in second PIM function block 730 may be provided to the memory cell core or group of the second core die of the write target. For example, the buffer A2 of first PIM function block 720 may be enabled according to the inverted values of the bits of the mask data, and the buffer B2 of second PIM function block 730 may be enabled according to the values of the bits of the mask data.

When the bits of the mask data have logic high and the write data is blocked from being written in the memory cell core or group, the buffer B2 of second PIM function block 730 may be enabled in response to the mask data having logic high, and thus the read data stored in second PIM function block 730 is provided to the memory cell core or group of the second core die of the write target. That is, the write data corresponding to the mask data having logic high may be blocked from being provided to the memory cell core or group of the second core die.

On the other hand, when the bits of the mask data have logic low, the buffer A2 of first PIM function block 720 is activated, and thus the write data provided from the memory controller is provided to the memory cell core or group of the second core die of the write target. On the other hand, since the buffer B2 of second PIM function block 730 is disabled, the read data may be blocked from being provided to the memory cell core or group of the second core die of the write target.

In the above-described embodiment, an example in which data read from the second core die of a mask write target is stored in second PIM function block 730 and the write data is stored in first PIM function block 720 has been described, but the embodiment is not limited thereto. For example, after the data read from the second core die is stored in first PIM function block 720 and the write data is stored in second PIM function block 730, the write data or the read data may be selectively written in the memory cell core or group of the second core die according to the values of the bits of the mask data.

According to the above-described embodiment, the mask write may be performed through the internal data processing operation in memory device 700 without the intervention of the memory controller. Further, the read data and the write data which are used in the internal data processing operation for the mask write may be transmitted and received between the core dies through the common internal processing channel provided by the internal common bus, and thus data bandwidth efficiency may be improved according to the decrease of an access frequency of a system to the memory device.

Figure 16:
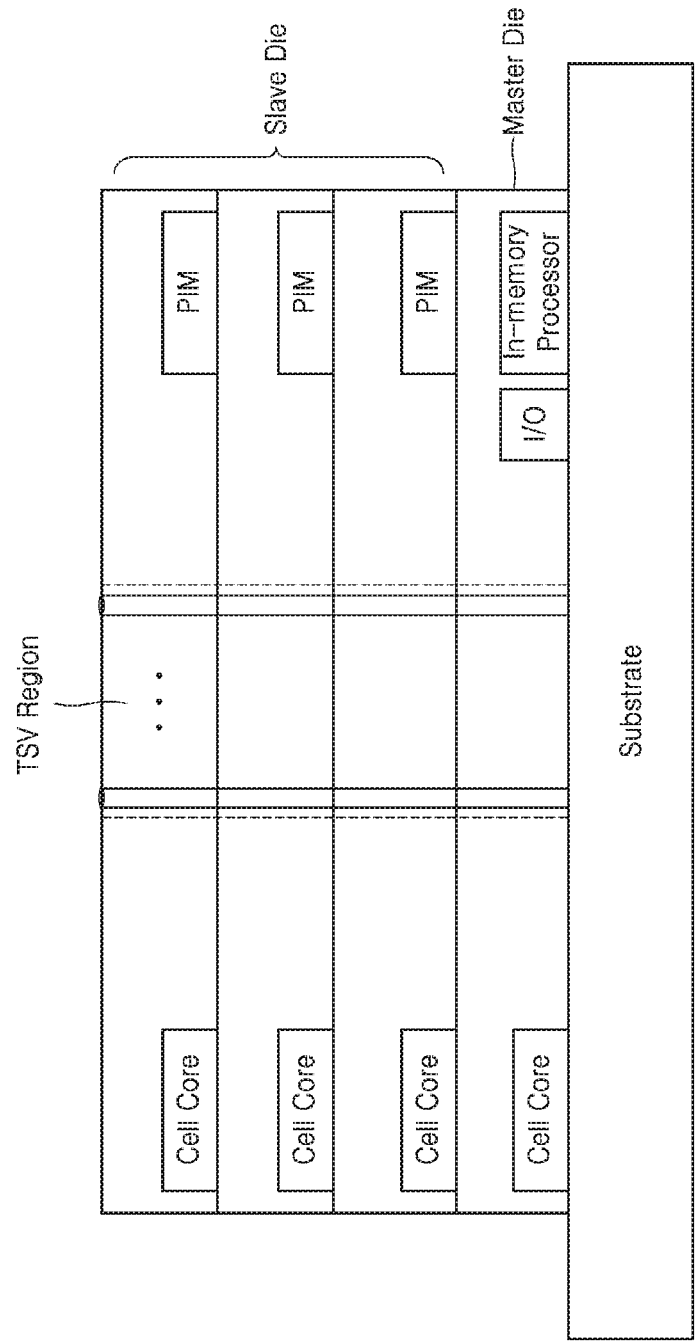
FIG. 16 is a block diagram illustrating a modifiable example embodiment of a memory device.

FIG. 16 is a block diagram illustrating a modifiable embodiment of a memory device. In FIG. 16, an example in which the memory device is illustrated which includes a plurality of layers, at least one of the plurality of layers constitutes a master die, and at least another thereof constitutes a slave die.

For example, the master die and the slave dies may be stacked on a substrate and the stacked master and slave dies may transmit and receive a signal through a TSV. Further, the master die and the slave dies may be implemented through the same memory process, and each of the master die and the slave dies may include a memory cell core or group which stores data. Further, the master die may include an I/O circuit for communicating with an external memory controller.

According to an embodiment, the master die may include an in-memory processor which serially generates internal commands for performing an internal process according to a command from the memory controller. Further, each of the slave dies includes a PIM function block, and various types of operations for data may be performed by the PIM function block inside the memory device according to the above-described embodiments. Further, at least some of a plurality of TSVs formed in a TSV area may be used as an internal common bus providing a common internal processing channel inside the memory device, and data may be transmitted and received between the master die and the slave dies through the common internal processing channel using the internal common bus.

Hereinafter, an example embodiment of a memory device in which the internal common bus is disposed in a buffer die (or, a master die) will be described.

Figure 17:
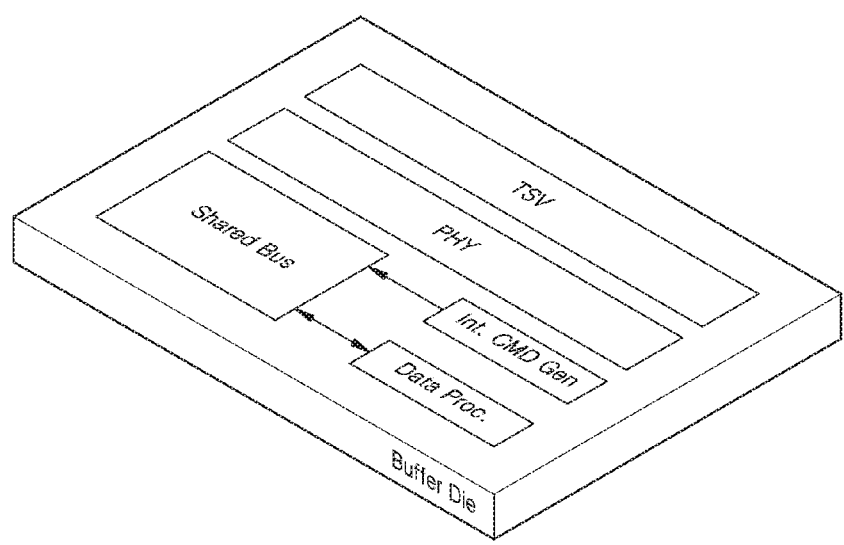
FIGS. 17 and 18 are block diagrams illustrating an example implementation of a buffer die included in an embodiment of a memory device.
Figure 18:
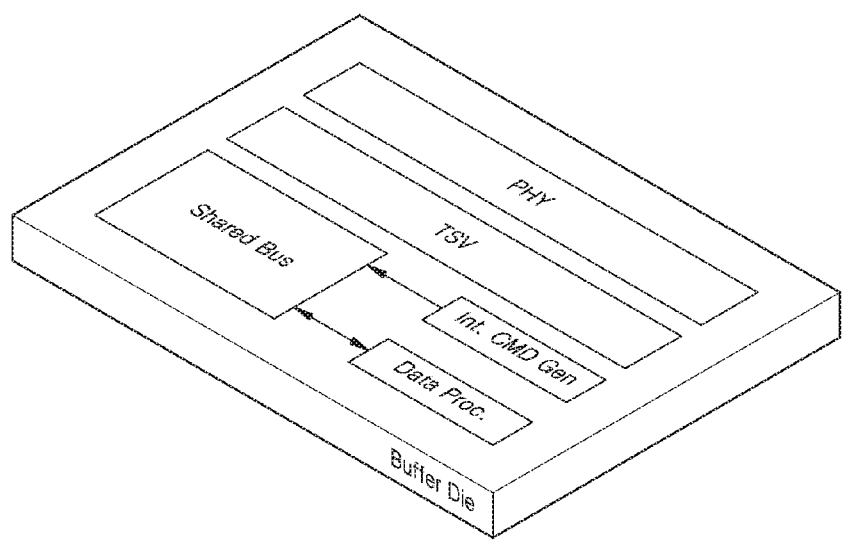

FIGS. 17 and 18 are block diagrams illustrating an example implementation of a buffer die included in an example embodiment of a memory device.

Similar to the above-described embodiment, the memory device includes a plurality of layers, and any one of the plurality of layers may be a buffer die (or, a master die) which communicates with an external memory controller. For example, the memory device may have an HBM form, and one or more core dies stacked on the buffer die may include a plurality of channels independent of each other. Further, for example, each of the core dies may include two or more independent channels for two or more memory cell groups.

The buffer die may include a physical area which interfaces with the memory controller and a TSV area in which a plurality of TSVs are formed to communicate with one or more core dies. Further, according to one embodiment, the buffer die may further include an internal common bus shared by a plurality of memory cell groups included in the core dies. Various types of signals may be provided to the plurality of memory cell groups through the internal common bus, supporting a common internal processing channel by which one or more internal data processing operations may be performed.

In one embodiment, the buffer die may further include an internal command generator and a data processor. For example, the internal command generator may be implemented as the in-memory processor in the above-described embodiments, and the data processor may be implemented as the PIM function block in the above-described embodiments.

The buffer die may generate internal commands for an internal data processing operation in response to the command from the memory controller, and provide the generated internal commands to the memory cell groups through the common internal processing channel using the internal common bus. Further, the data processor may perform a processing operation for write data from the outside, and a processing operation for data read from one or more core dies. Data before processing and/or processed data may be provided to the memory cell groups through the common internal processing channel using the internal common bus.

The internal common bus may be connected to a TSV area through a physical area having I/O circuits corresponding to the plurality of memory cell groups. The same as or similar to the above-described embodiments, the memory device may perform data copy, data swap, RMW, mask write, and the like as the internal data processing operation without the intervention of the memory controller. Further, the data may be transmitted and received between the plurality of memory cell groups through the common internal processing channel using the internal common bus.

Meanwhile, in the embodiment of FIG. 18, an example in which a signal transmission path of the buffer die has an order of the physical area, the TSV area, and the internal common bus is illustrated. In this case, the internal command from the internal command generator or the data from the data processor may be provided to the core dies through the internal common bus and the TSVs of the TSV area without passing through the physical area.

Figure 19:
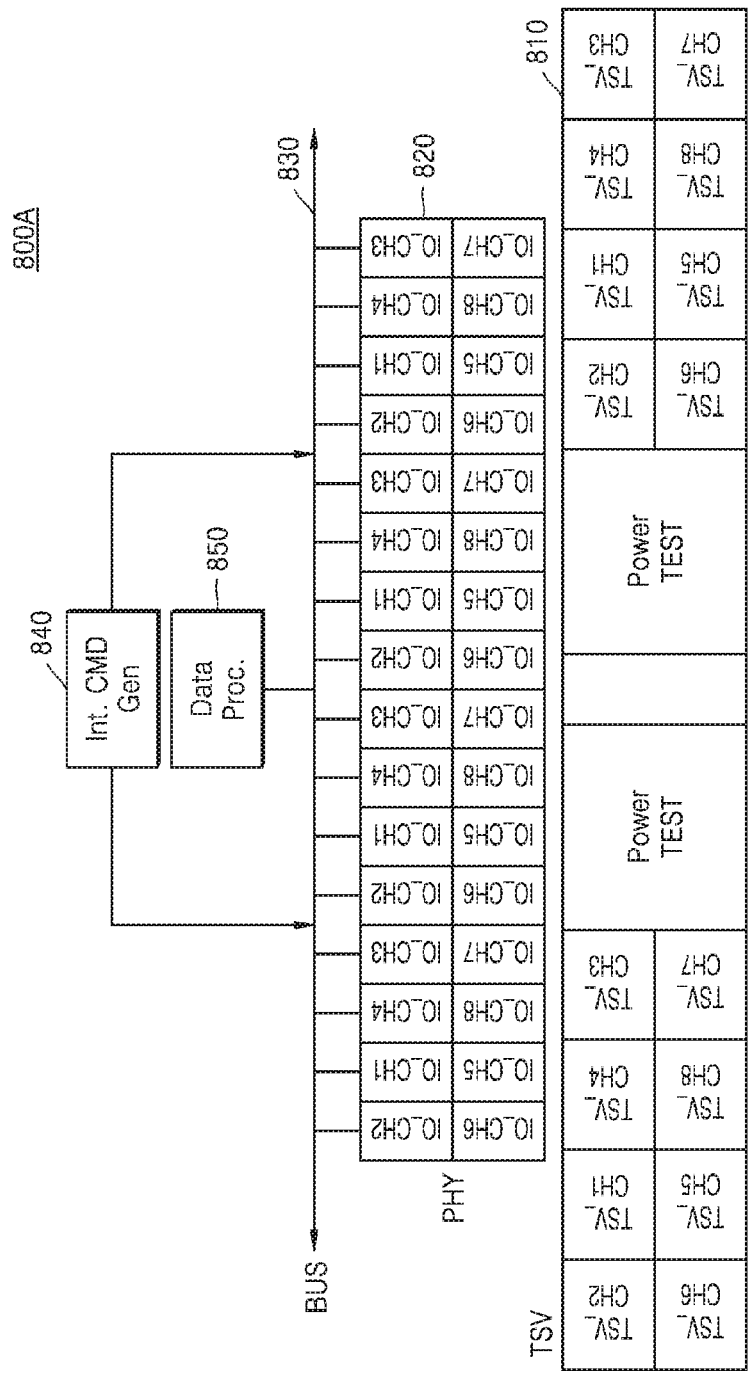
FIGS. 19 and 20 are diagrams illustrating example implementations of the above-described buffer dies illustrated in FIGS. 17 and 18 in detail.
Figure 20:
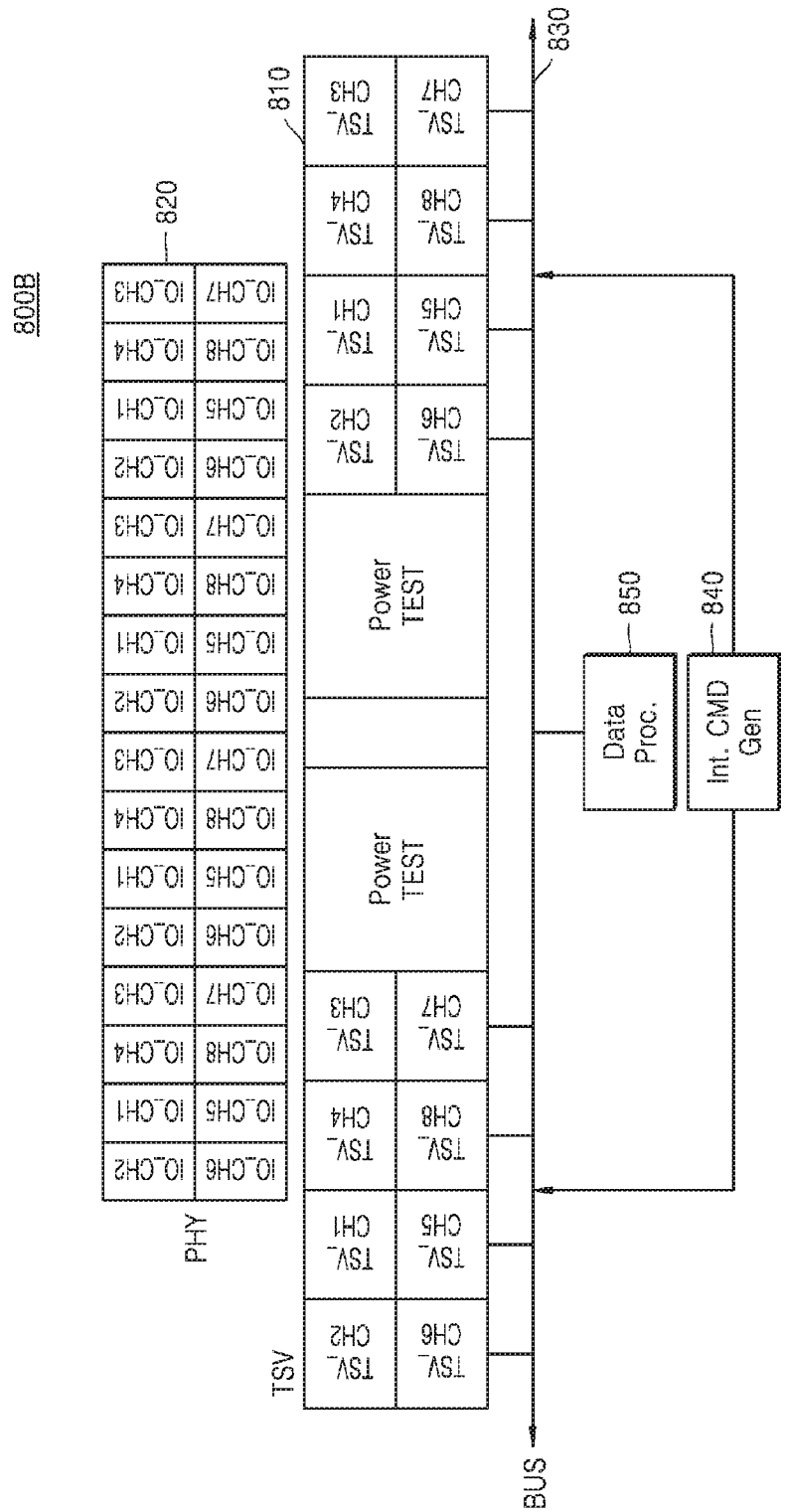

FIGS. 19 and 20 are diagrams illustrating example implementations of the above-described buffer dies illustrated in FIGS. 17 and 18 in detail.

Referring to FIG. 19, a buffer die 800A of the memory device may include a TSV area 810, a physical area 820, and an internal common bus 830. TSV area 810 may include TSVs having independent signal transmission paths for a plurality of memory core groups, and may provide, for example, a command to the core dies through different command TSVs for each memory cell group, and provide data to the core dies through different data TSVs for each memory cell group. According to one embodiment, as illustrated in FIG. 19, TSV area 810 may include TSVs which deliver signals related to the memory operations of the memory cell groups, and may further include additional TSVs used in a separate test (e.g., a power test).

Physical area 820 may also communicate with the external memory controller through different I/O circuits for each memory cell group, and signals from the different I/O circuits for each memory cell group may be provided to the corresponding TSV of the memory cell group. Further, internal common bus 830 may be commonly connected to the I/O circuits corresponding to the plurality of memory cell groups of physical area 820.

Internal command generator 840 may generate a series of internal commands for the internal data processing operation in the memory device, and may provide the series of internal commands to internal common bus 830. The internal commands are provided to the core dies through physical area 820 and TSV area 810. Further, according to the above-described embodiments, data processor 850 may perform a data processing operation related to various types of memory operations such as data copy, data swap, RMW, mask write, and the like. According to one embodiment, data from data processor 850 is provided to internal common bus 830, and the data provided to internal common bus 830 is provided to the core dies through physical area 820 and TSV area 810. Further, the data read from any one core die may be provided to data processor 850 through internal common bus 830, and the processed data from data processor 850 may be provided to another core die through the internal common bus 830.

Meanwhile, a buffer die 800B of the memory device illustrated in FIG. 20 may have the similar components to the above-described buffer die 800A illustrated in FIG. 19, and may have a structure in which internal common bus 830 is connected to the TSV area 810. In this case, internal commands from internal command generator 840 or data from data processor 850 may be directly provided to the TSV area 810 and delivered to the core dies.

Figure 21:
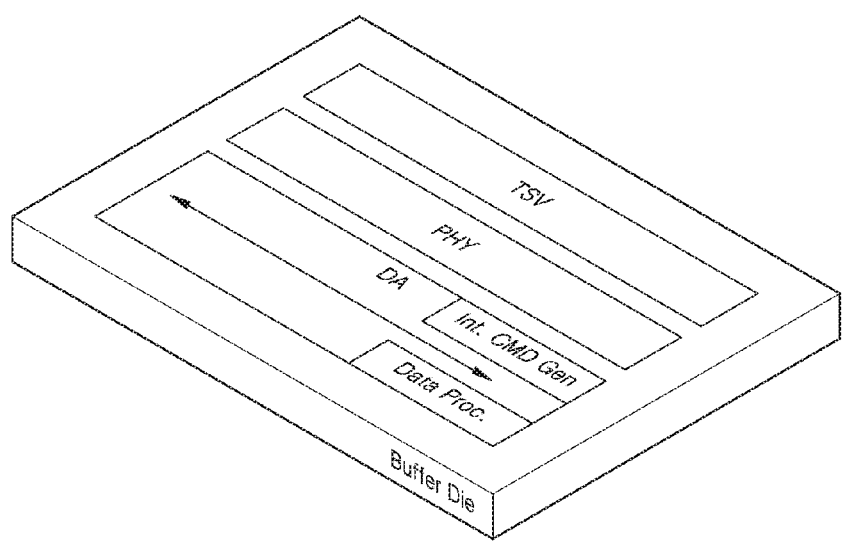
FIGS. 21 and 22 are block diagrams illustrating modifiable example implementations of the buffer dies.
Figure 22:
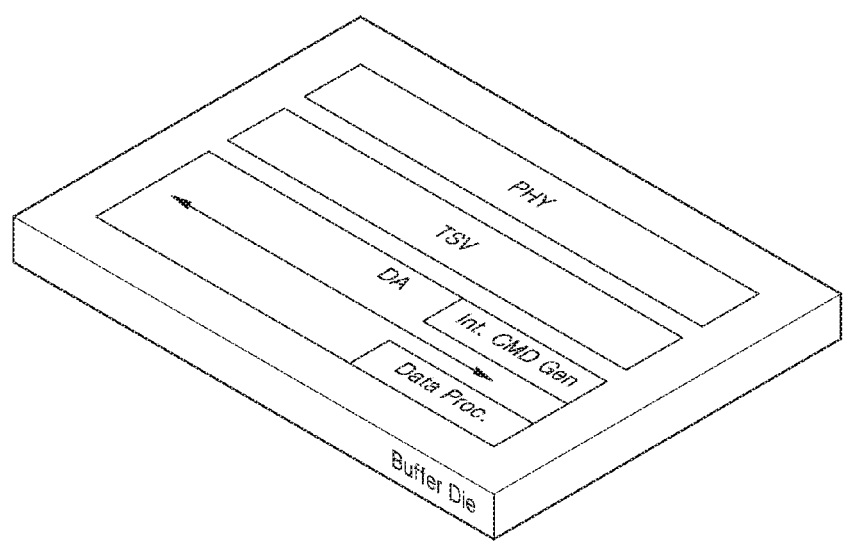

FIGS. 21 and 22 are block diagrams illustrating modifiable example implementations of the buffer dies according to some embodiments. In FIGS. 21 and 22, examples in which a bus which delivers a test signal in a DA area of the buffer die is used as an internal common bus for a common internal processing channel is illustrated.

Referring to FIG. 21, the buffer die may include a physical area which interfaces with the memory controller and a TSV area in which a plurality of TSVs are formed to communicate with one or more core dies. Further, the buffer die may further include a DA area in which a bus which may directly communicate with an external tester is disposed, regardless of the memory controller. A signal related to the test, which is provided to the DA area, may be delivered to the TSVs through the bus in the DA area, and a test result may be provided to the external tester through the TSV area and the DA area.

A test operation using the DA area may be performed with respect to a plurality of memory cell groups, and in this case, a bus in the DA area related to the test may be implemented to be shared by the plurality of memory cell groups of the memory device. According to one embodiment, the bus in the DA area may be used as an internal common bus for an internal data processing operation of the memory device. Further, the internal command generator for the internal data processing operation may generate an internal command and provide the generated internal command to the core dies through the bus in the DA area. Further, data read from the core dies may be provided to the data processor through the bus in the DA area, and data from the data processor may be provided to the core dies through the bus in the DA area.

Meanwhile, referring to FIG. 22, the buffer die may include a physical area and a TSV area, and a DA area including a bus shared by a plurality of memory cell groups may be disposed adjacent to the physical area. The bus in the DA area may be used as an internal common bus providing a common internal processing channel for the internal data processing operation. In the above-described example of FIG. 21, the signal transmission through the internal common bus in the DA area may be provided to the core dies through the TSV area without passing through the physical area. On the other hand, in the present example of FIG. 22, the internal command and data which are delivered through the internal common bus may be provided to the core dies through the physical area and the TSV area.

Meanwhile, in the examples illustrated in FIGS. 21 and 22, the internal command generator and the data processor are illustrated to be included in the DA area, but the embodiments are not limited thereto. For example, the internal command generator and the data processor may be disposed outside the DA area in the buffer die.

Figure 23:
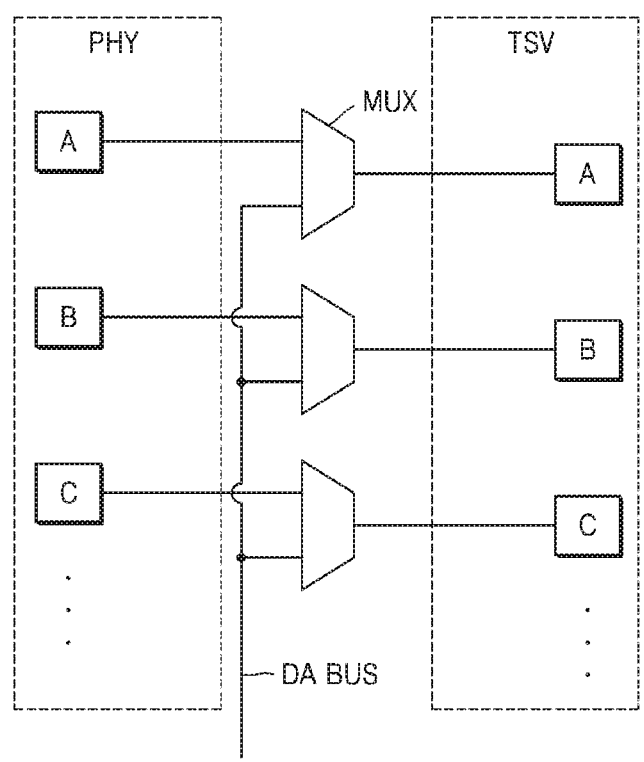
FIGS. 23 and 24 are block diagrams illustrating examples of signal transmission paths in the above-described buffer dies illustrated in FIGS. 21 and 22.
Figure 24:
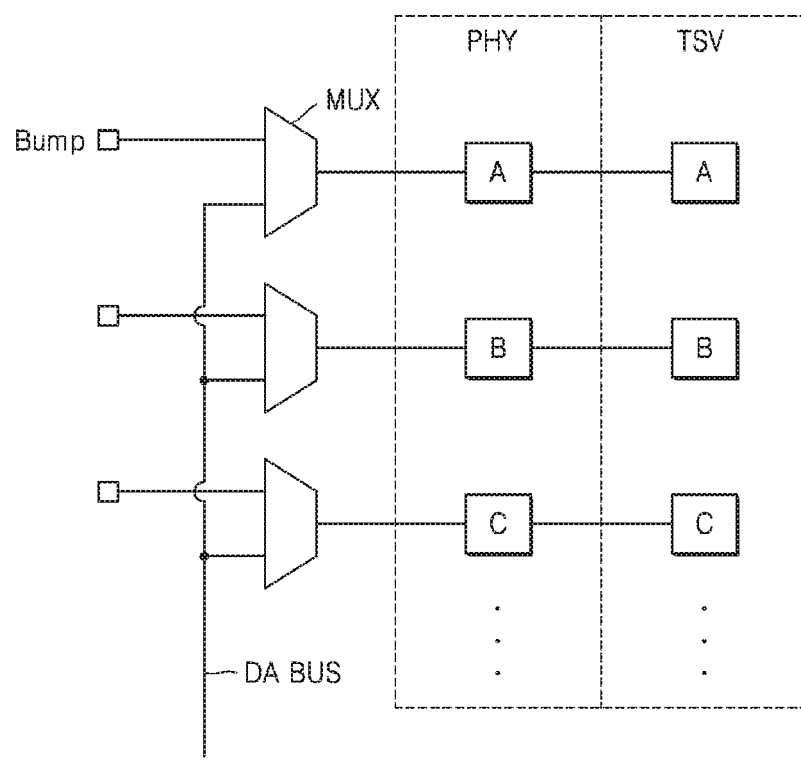

FIGS. 23 and 24 are block diagrams illustrating examples of signal transmission paths in the above-described buffer dies illustrated in FIGS. 21 and 22.

Referring to FIG. 23, an internal command and data from an internal common bus DA BUS in a DA area may be provided to a TSV area without passing through a physical area. For example, the physical area includes independent I/O circuits for each memory cell group, and thus a signal with respect to a memory cell group A is delivered to core dies through a TSV corresponding to the memory cell group A in the TSV area. Similarly, a signal with respect to a memory cell group B is delivered to the core dies through a TSV corresponding to the memory cell group B in the TSV area, and a signal with respect to a memory cell group C is delivered to the core dies through a TSV corresponding to the memory cell group C in the TSV area.

The internal common bus DA BUS in the DA area may be disposed to be shared by the plurality of memory cell groups, and selectors (e.g., multiplexers) for selecting a signal from the physical area and a signal delivered through the internal common bus DA BUS may be included in the buffer die. For example, when the internal command/data is independently delivered for each memory cell group, the internal command and data from the physical area are selected and delivered to the core dies through the TSV. On the other hand, when the internal command or the data is provided to the core dies in an internal data processing operation, the internal command or the data is selected and delivered to the core dies through the TSV.

Meanwhile, in FIG. 24, an example in which the internal command or the processed data is provided to the core dies through the physical area and the TSV area is illustrated.

Referring to FIG. 24, an internal common bus DA BUS in a DA area may be disposed on a front end of a physical area, and selectors (e.g., multiplexers) for selecting a signal independently provided for each memory cell group and a signal delivered through the internal common bus DA BUS may be disposed on the front end of the physical area. For example, the command/the data independently delivered for each memory cell group may be received through bumps formed on an outer surface of the memory device. The signal delivered through the bumps may be selected in a normal operation in which signals are independently delivered for each memory cell group via corresponding independent channels, and the signal delivered through the internal common bus DA BUS may be selected for an internal data processing operation in the above-described embodiments.

Figure 25:
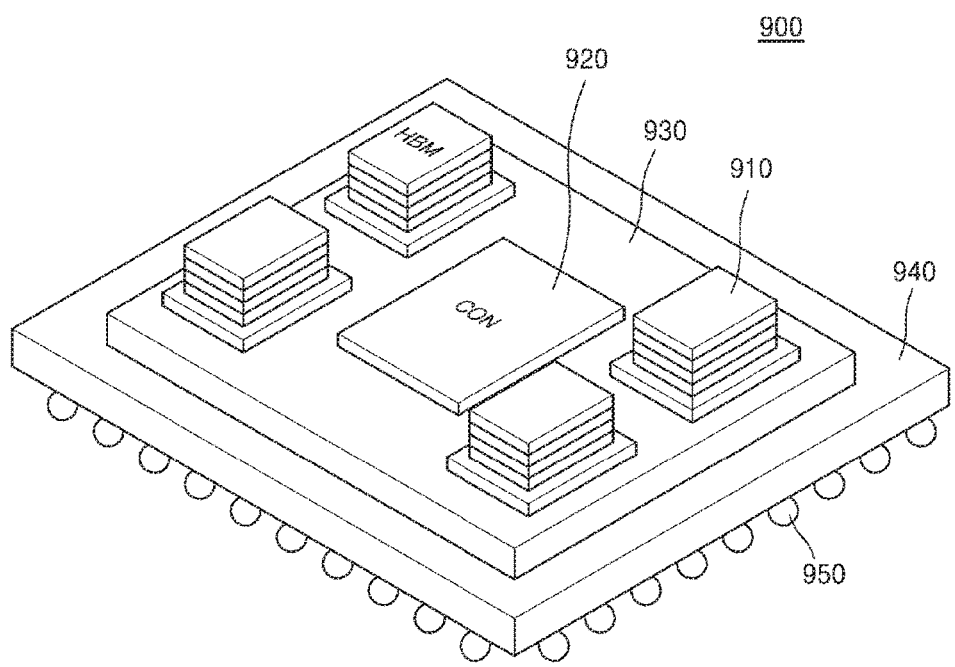
FIG. 25 is a configuration diagram illustrating an example of a semiconductor package including example embodiments of memory devices.

FIG. 25 is a configuration diagram illustrating an example of a semiconductor package including embodiments of memory devices.

Referring to FIG. 25, a semiconductor package 900 may include one or more memory devices 910 and a memory controller 920. Memory devices 910 and memory controller 920 may be mounted on an interposer 930, and the interposer on which memory device 910 and memory controller 920 are mounted may be mounted on a package substrate 940. Memory controller 920 may correspond to a semiconductor device which may perform a memory control function, and for example, memory controller 920 may be implemented as an application processor (AP).

Memory device 910 may be implemented in various forms, and memory device 910 according to one embodiment may be a memory device in an HBM form in which a plurality of layers are stacked. Accordingly, memory device 910 according to one embodiment may include a plurality of memory cell groups accessible by corresponding independent channels, and an internal common bus providing a common internal processing channels disposed to be shared by the plurality of memory cell groups. Further, an internal command generator which generates an internal command for an internal data processing operation, and a data processor which performs processing for write data and/or read data may be included in memory device 910.

The plurality of memory devices 910 may be mounted on the interposer, and memory controller 920 may communicate with the plurality of memory devices 910. For example, each of memory devices 910 and memory controller 920 may include a physical area, and communication may be performed between memory devices 910 and memory controller 920 through the physical areas. Meanwhile, when memory device 910 includes a DA area, a test signal may be provided into memory device 910 through conductive means (e.g., solder balls 950) mounted under package substrate 940 and the DA area.

Here, the interposer may include an embedded multi-die interconnect bridge (EMIB) which is an organic or non-TSV manner having a TSV form or a printed circuit board (PCB) form.

In a memory device for performing an internal data processing operation, since a series of memory operations according to a command from a memory controller may be performed through the internal data processing operation of the memory device without the intervention of the memory controller, an access frequency of a system to the memory device can be reduced, and thus there is an effect in which data bandwidth efficiency can be improved.

While the inventive concept has been described with reference to exemplary embodiments illustrated in accompanying drawings in order to further thorough understand of the inventive concept, it should be understood as not limiting the inventive concept. Further, it will be clear to those skilled in the art that various changes and modifications may be made therein without departing from the spirit and scope of the inventive concept.

What is claimed is:

1. A memory device, comprising:
   a buffer die having an internal command generator configured to receive from an external memory controller a first external command for performing at least one internal data processing operation by the memory device, and in response thereto to generate at least two internal commands for causing the memory device to execute corresponding internal memory operations to perform the at least one internal data processing operation;
   a first core die and a second core die stacked together with the buffer die, each of the first and second core dies having a plurality of dynamic random access memory (DRAM) cells, the DRAM cells being arranged into at least a first memory cell group of the first core die and a second memory cell group of the second core die;
   a plurality of through silicon vias (TSVs) extending through the first and second core dies so as to connect to the buffer die;
   at least two independent channels each associated with a corresponding one of the first and second memory cell groups, the at least two independent channels each including a corresponding set of the TSVs; and
   a common internal processing channel shared among the first and second memory cell groups of the first and second core dies.

2. The memory device of claim 1, wherein each of the at least two independent channels include a corresponding independent data bus for the corresponding memory cell group, and wherein the common internal processing channel includes a common internal data bus which is shared among the at least two memory cell groups.

3. The memory device of claim 1, wherein each of the at least two independent channels include a corresponding independent command/address bus for the associated memory cell group, and wherein the common internal processing channel includes a common internal command/address bus which is shared among the at least two memory cell groups.

4. The memory device of claim 1, wherein each of the at least two independent channels include a corresponding independent command/address bus for the associated memory cell group, and the memory device further comprising at least two independent internal command/address signal buses each associated with one of the at least two memory cell groups.

5. The memory device of claim 1, wherein the common internal processing channel includes at least some of the TSVs, the TSVs of the common internal processing channel being shared by at least two of the memory cell groups when the memory device performs the at least one internal data processing operation.

6. The memory device of claim 1, wherein the first core die includes at least a first data processor associated with the first memory cell group, wherein the second core die includes at least a second data processor associated with the second memory cell group, wherein the data processors are configured to perform the at least one internal data processing operation in response to at least one control signal provided by the internal command generator.

7. The memory device of claim 6, wherein the at least one internal data processing operation comprises at least one of a data addition operation, an exclusive OR operation, a data subtraction operation, and a data multiplication operation.

8. The memory device of claim 1, wherein when the external memory device receives a second external command from the memory controller which is a normal command, then the normal command is provided to one of the memory cell groups through its associated independent channel.

9. A memory device, comprising:
a buffer die having an internal command generator configured to receive from an external memory controller a first external command for performing at least one internal data processing operation by the memory device, and in response thereto to generate at least two internal commands for causing the memory device to execute corresponding internal memory operations to perform the at least one internal data processing operation;
at least one core die stacked together with the buffer die, the at least one core die having a plurality of dynamic random access memory (DRAM) cells arranged into a plurality of memory cell groups;
a plurality of through silicon vias (TSVs) extending through the at least one core die so as to connect to the buffer die; and
at least two independent channels each associated with a corresponding one of the memory cell groups, the at least two independent channels each comprising a corresponding set of the TSVs,
wherein at least some of the TSVs are shared by at least two of the plurality of memory cell groups when the memory device performs the at least one internal data processing operation.

10. The memory device of claim 9, wherein the at least some of the TSVs which are shared by at least two of the plurality of the memory cell groups comprise a common internal processing channel shared among the plurality of memory cell groups.

11. The memory device of claim 9, wherein the first external command comprises at least one of a data copy command, a data swap command, a read-modify-write command, and a mask-write command.

12. The memory device of claim 9, further comprising a plurality of data processors, each data processor being associated with one of the memory cell groups and provided on a same core die as the associated memory cell group, wherein the data processors are configured to perform the at least one internal data processing operation in response to at least one control signal provided by the internal command generator.

13. The memory device of claim 9, wherein the at least one internal data processing operation comprises at least one of a data addition operation, an exclusive OR operation, a data subtraction operation, and a data multiplication operation.

14. The memory device of claim 9, wherein when the memory device receives a second external command from the external memory controller which is a normal command, then the normal command is provided to one of the plurality of memory cell groups through its associated independent channel.

15. A memory device, comprising:
a plurality of dynamic random access memory (DRAM) cells arranged into a plurality of memory cell groups;
a plurality of independent channels each associated with a corresponding one of the plurality of memory cell groups;
an internal command generator configured to receive from an external memory controller at least a first external command for performing at least one internal data processing operation by the memory device, and in response thereto to generate at least two internal commands for causing corresponding memory operations to be executed to perform the at least one internal data processing operation; and
a common internal processing channel shared among the plurality of memory cell groups,
wherein the first external command comprises at least one of a data copy command, a data swap command, a read-modify-write command, and a mask-write command.

16. The memory device of claim 15, wherein the plurality of independent channels each associated with a corresponding one of the at least two memory cell groups are configured for performing normal operations for the DRAM cells of the plurality of memory cell groups, and the common internal processing channel is shared among the at least two memory cell groups for performing internal data processing operations for the DRAM cells of the at least two memory cell groups.

17. The memory device of claim 15, further comprising a plurality of data processors associated with one of the memory cell groups, wherein the data processors are configured to perform the at least one internal data processing operation on data for the associated memory cell group in response to at least one control signal provided by the internal command generator.

18. The memory device of claim 17, wherein the at least one internal data processing operation comprises at least one of a data addition operation, an exclusive OR operation, a data subtraction operation, and a data multiplication operation.

19. The memory device of claim 15, wherein when the memory device receives a second external command from the memory controller which is a normal command, then the normal command is provided to one of the plurality of memory cell groups through its associated independent channel.

\* \* \* \* \*